(12) United States Patent
Ogura

(10) Patent No.: US 7,759,698 B2
(45) Date of Patent: Jul. 20, 2010

(54) PHOTO-FIELD EFFECT TRANSISTOR AND INTEGRATED PHOTODETECTOR USING THE SAME

(75) Inventor: Mutsuo Ogura, Tsukuba (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 62 days.

(21) Appl. No.: 12/191,913

(22) Filed: Aug. 14, 2008

(65) Prior Publication Data

US 2008/0308840 A1 Dec. 18, 2008

Related U.S. Application Data

(63) Continuation of application No. PCT/JP2007/052913, filed on Feb. 13, 2007.

(30) Foreign Application Priority Data

Feb. 14, 2006 (JP) ............................ 2006-035927

(51) Int. Cl.
*H01L 29/80* (2006.01)
(52) U.S. Cl. ................ 257/185; 257/256; 257/E31.082
(58) Field of Classification Search ................. 257/185, 257/186, 187, 192, 256
See application file for complete search history.

(56) References Cited

U.S. PATENT DOCUMENTS 4,878,120 A 10/1989 Matsumoto et al.

(Continued)

FOREIGN PATENT DOCUMENTS

JP 53-96720 8/1978

(Continued)

OTHER PUBLICATIONS

Yoshimi Yamashita, et al., IEEE Electron Device Letters, vol. 23, No. 10, Oct. 2002, Pseudomorphic In $_{0.52}$ Al $_{0.48}$ As/In $_{0.7}$ Ga $_{0.3}$ As HEMTs With an Ultrahigh ƒT of 562 GHz, pp. 573-575.

(Continued)

*Primary Examiner*—Phat X Cao
*Assistant Examiner*—Nga Doan
(74) *Attorney, Agent, or Firm*—Oblon, Spivak, McClelland, Maier & Neustadt, L.L.P.

(57) ABSTRACT

A photo-FET based on a compound semiconductor including a channel layer formed on a substrate constituting a current path between source and drain electrodes, serving as part of a photodiode and a photosensitive region. A back-gate layer that serving as a substrate-side depletion layer formation layer is disposed between the substrate and the channel layer, and applies to the channel layer a back-gate bias by photogenerated carriers upon illumination. A barrier layer is disposed on the front side of the channel layer that causes one of the photogenerated carriers to run through the channel layer and other of the photogenerated carriers to sojourn or be blocked off. A front-side depletion layer formation layer is disposed on the front side of the channel layer brings the front-side depletion layer into contact with the substrate-side depletion layer without illumination to close the current path in the channel layer, bringing the photo-FET to an off-state.

15 Claims, 9 Drawing Sheets

U.S. PATENT DOCUMENTS

| | | | | |
|---|---|---|---|---|
| 7,629,663 | B2* | 12/2009 | Pardo et al. | 257/448 |
| 2007/0090396 | A1* | 4/2007 | Linder et al. | 257/185 |

FOREIGN PATENT DOCUMENTS

| | | |
|---|---|---|
| JP | 59-43581 | 3/1984 |
| JP | 59-107578 | 6/1984 |
| JP | 60-206063 | 10/1985 |
| JP | 2-1694 | 1/1990 |
| JP | 2-5533 | 1/1990 |
| JP | 5-275474 | 10/1993 |
| JP | 61-185976 | 8/1996 |
| JP | 8-227900 | 9/1996 |
| JP | 9-260711 | 10/1997 |
| JP | 2000-340827 | 12/2000 |
| JP | 2001-111093 | 4/2001 |
| JP | 2001-111096 | 4/2001 |
| JP | 2001-332758 | 11/2001 |
| JP | 2003-273126 | 9/2003 |
| JP | 2004-241487 | 8/2004 |
| JP | 2005-203428 | 7/2005 |
| WO | WO 2007/094493 | 8/2007 |

OTHER PUBLICATIONS

Hongjoo Song, et al., Extended Abstracts of the 2003 International Conference on Solid State Devices and Materials, Tokyo, 2003, Analysis of AlGaAs/GaAs Heterojunction Photodetector with a Two-Dimensional Channel Modulated by Gate Voltage, pp. 186-187.

Photoluminescence of InSb, InAs, and InAsSb Grown by Organometallic Vapor Phase Epitaxy, Z.M. Fang et al., Dept. of Materials Science and Engineering, University of Utah, Salt Lake City, Utah 84112, J. Appl. Phys. 67 (11), Jun. 1, 1990, pp. 7034-7039.

Band Offset of GaAs/In$_{0.48}$Ga$_{0.52}$P Measured Under Hydrostatic Pressure, Jianhui Chen et al., Dept. of Physics, Colorado State University, Fort Collins, Colorado 80523, Appl. Phys. Lett. 58 (7), Feb. 18, 1991, pp. 744-746.

"III Zoku Genshi Hyomen Kakusan Seigyo MBE ni yoru InGaAs Ryoshi Saisen no Sakusei", Fabrication of InGaAs Quantum Wires by Surface-Diffusion-Controlled Molecular Beam Epitaxy, IEICE Technical Report, vol. 98, No. 385 (CPM98 127-135), 1998, Tanuma et al., pp. 13-18.

Determination of Al Mole Fraction for Null Conduction Band Offset in In$_{0.5}$Ga$_{0.5}$P/Al$_x$Ga$_{1-x}$As Heterojunction by Photoluminescence Measurement, Kim et al., Appl. Phys. Lett. 37 (12), Sep. 18, 1995, pp. 1718-1720.

Properties of Lattice-Matched and Strained, Indium Gallium Arsenide, emis Datareviews Series, No. 8, 3.4 Heterojunctions of InGaAs and band offsets, pp. 86-87 w/cover sheet.

Solid-State Time-of-Flight Range Camera, IEEE Journal of Quantum Electronics, vol. 37, No. 3, Mar. 2001, Robert Lange and Peter Seitz, pp. 390-397.

Chapter 4, Principle of Operation of VMIS Image Sensor having New Type Pixel Structure in CMOS Process, Hirofumi Komori, Feb. 2003, pp. 160-169, w/English (2 pages).

\* cited by examiner

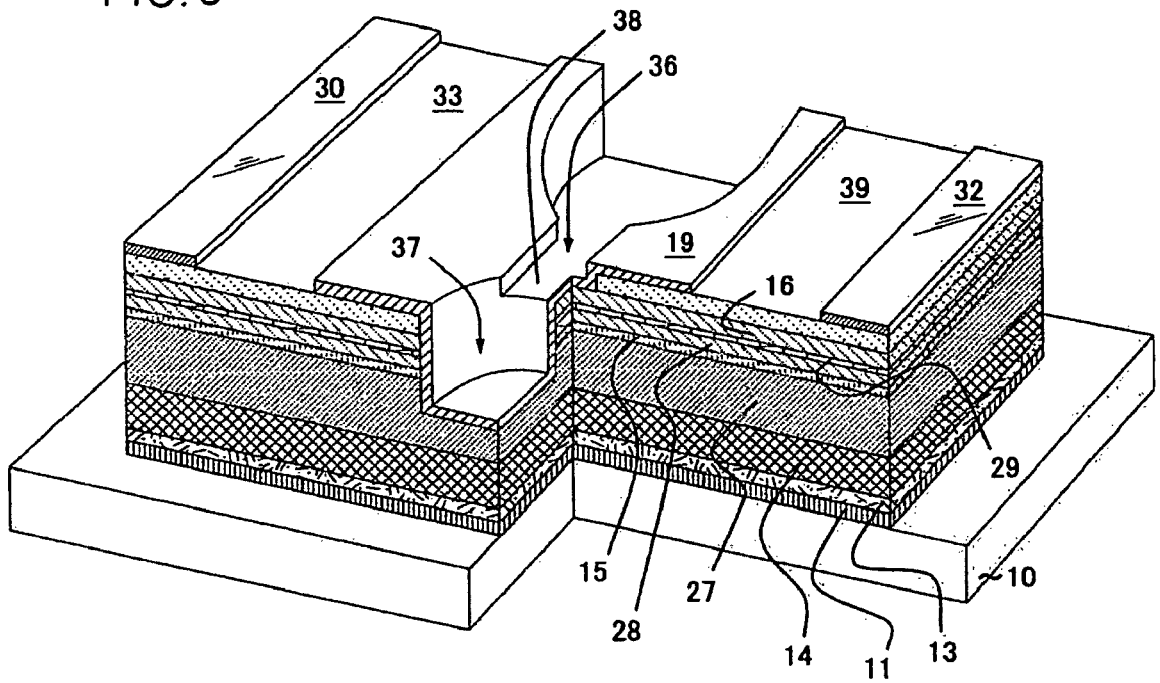

PHOTO-FIELD EFFECT TRANSISTOR AND INTEGRATED PHOTODETECTOR USING THE SAME

CROSS-REFERENCE TO PRIORITY DATA

The present application is a continuation of Application PCT/JP 2007/052913 filed on Feb. 13, 2007, and also claims priority to JP 2006-035927 filed on Feb. 14, 2006, the entire contents of each of which are herein incorporated by reference.

BACKGROUND OF THE INVENTION

1. Field of the Invention

The present invention relates to an improvement in a photo-field effect transistor (hereinafter referred to also as a "photo-FET") in which a photodiode and a field-effect transistor (hereinafter referred to also as a "FET") are integrated monolithically.

2. Discussion of the Background

A photodetector in a near-infrared region, particularly a photodetector array in which plural photodetectors are arranged one- or two-dimensionally, has been in high demand as an infrared photodetector for spectroscopic systems or an infrared camera in a variety of applications in the fields of medicine, disaster prevention and industrial inspection. For instance, in the field of medicine and biometrics, a non-invasive behavior has been reaffirmed and commercialized into such as an "In vivo oxygen monitoring device" or "Authentication system for blood vessel figure" utilizing the spectroscopic characterization of Hemoglobin between 0.7~0.9 µm in the near infrared region. An applicable scope may be expanded to a diagnosis with Optical Topography or a biometrics when a detection wavelength is set to an infrared region of 1.2 to 1.5 µm. Under such conditions, in-vivo permeability is increased further, and a so called "eye safe" condition will be realized even if someone contemplates the light source.

Also, a detection system for weak light in an infrared region has been in great demand in relation to the single molecule detection by a fluorescent label that has recently received a lot of attention, in view of the fact that the in-vivo emission wavelength by singlet oxygen is 1269 nm etc. Also, in the field of disaster prevention and security, a relatively strong lighting is possible. Therefore, a night-vision camera is expected to be realized coping with the recognition of a living body and a temperature measurement function utilizing the specific infrared photo-absorption properties of a substance such as temperature and moisture. Furthermore, when the wavelength range is expanded up to 5 µm, it becomes possible to detect thermal images or poisonous gases, such as CO, and to work for disaster prevention and remote sensing.

Another important field of application is that of distance recognition or moving body recognition using an imaging device having a function called a "smart pixel." As disclosed in Document 1, for example, a camera has been developed that measures a distance from the phase of modulated light with a frequency of several MHz. This camera performs a so-called lock-in detection using a switch synchronized in a modulation frequency with a silicon CCD (Charge Coupled Device).

Document 1: Robert Lange and Peter Seitz, "Solid-State Time-of-Flight Range Camera", IEEE JOURNAL of QUANTUM ELECTRONICS, VOL. 37, NO. 3, pp. 390-397 (MARCH 2001).

Here, when looking to the structure of a fundamental photodetector per se, the conventional photodetector capable of detecting the infrared region is classified roughly into types 1) to 3) noted below.

1) A photomultiplier tube (PMT) of a type multiplying electrons emitted from a photoelectric conversion surface by incidence of light to detect electric charge, or a CCD camera with an electron multiplying mechanism (for example, Electron Bombardment CCD Camera: EB-CCD camera produced by Hamamatsu Photonics K.K.).

2) A PIN photodiode that detects a photoexcited current in a compound semiconductor.

3) An avalanche photodiode that multiplies a photoexcited current within a semiconductor.

In the case of the PMT and avalanche photodiode, however, there are intrinsic problems to establish a detector array, since a highly accelerated voltage is required for accelerating and multiplying electrons generated by light in a vacuum or solid substance, and since there are considerable variations in the multiplication characteristics.

Also in the EB-CCD camera, since an induced electrostatic discharge damages a micro CCD at several volts, it is actually difficult to combine the CCD with an electron multiplying plate requiring an accelerated voltage of 1 KV. Therefore, the EB-CCD camera as a product is too expensive to reach a level that satisfies extensive demands. While a PIN photodiode using a compound semiconductor is simple in structure and relatively easy to establish integration, however, detection limit of the PIN photodiode is much inferior to a silicon CCD. Further, the PIN photodiode is low in sensitivity and is greatly affected by a readout noise from an external amplifier, and has no charge storage mechanism, unlike the silicon CCD.

Another serious problem posed by a background photodetector is that a sensitive wavelength region is limited. Though an image pickup device has been developed in various aspects within a visible region, the image pickup device has insufficient sensitivity at an ultraviolet region in the wavelength of 150 nm to 300 nm or at an infrared region in the wavelength longer than 1 µm. The image pickup device has been required to dispose a plurality of photodetectors having different sensitive characteristics to cope with a wavelength region over a wide range, resulting in a complicated optical system.

In a photodetector having a photosensitive layer of silicon and coping with wavelengths from visible to near-infrared regions, but not a compound semiconductor-based photodetector, a phototransistor that amplifies a photo-induced current with a transistor integrated within a semiconductor is used in an optical relay or image pickup device. Particularly, a CMOS image sensor is increasingly popular as an image pickup device for a high-resolution camera or video camera. The CMOS image sensor is suited for high density integration since it adopts an active cell system having a photodetector and a MOSFET combined within a single pixel.

Furthermore, as disclosed in Documents 2 and 3 listed below, there is a silicon-based photodetector called a VMIS (threshold Voltage Modulation Image Sensor), in which it is intended to combine a photodetector and an FET by interconnecting an output from a built-in photodiode with the back gate of a MOSFET using a p-type well inside of the device.

Document 2: JP-A 2004-241487.

Document 3: "Principle of Operation of VMIS," Transistor Technology, p. 160, February 2003, published by CQ Publishing Co., Ltd. having a business place at 1-14-2 Sugamo, Toshima-ku, Tokyo.

However, the photogenerated carriers are dissipated without any countermeasures because the respective contact parts of the source and drain have to be deservingly deprived of silicon oxide film for a gate insulator. For this reason, it is necessary to adopt an additional process of providing a hole-storage layer around the gate and source electrodes and an impurity concentration gradient in the lateral direction, thereby producing a potential barrier that prevents the carriers from flowing out of the source electrode. To form such impurity distributions, it is additionally required to perform multiple ion implantation processes. The device isolation process of the VMIS is rather difficult since it is a bipolar device. Thus, the device fabrication process becomes complicated as compared to an ordinary CMOS image sensor.

As an integrated image sensor using a compound semiconductor device having sensitivity within an infrared region, an infrared camera using a Focal Plane Array (FPA) having an integration scale from 320×256 pixels to a VGA (640×480 pixels) has been developed. This infrared camera is lightweight and highly sensitive, but exhibits less persistence of vision as compared with a conventional infrared camera of an image pickup tube system, and thus has been gradually growing in popularity. However, since the light-receiving device per se used in an FPA has no addressing function, realization of an image pickup device requires complicated manufacturing operations such as a wafer thinning process of a two-dimensional compound semiconductor PIN photodetector array and bonding it to a two-dimensional silicon-charge amplifier array. Furthermore, the FPA has not yet solved the problem of a large influence of a readout noise by an external amplifier since it is required to amplify a minute current induced by photo-generated electron-hole pairs corresponding at most to the number of photons in the incident light, similarly to the case of a discrete PIN photodetector.

Highly sensitive photodetectors incorporated with the active devices, such as a heterojunction bipolar transistor (HBT) and a High Electron Mobility Transistor (HEMT), have been studied as compound semiconductor devices having the sensitivity within an infrared region in parallel. Among them, an FET has a simple structure and has been widely utilized mainly as a unipolar device for the application of high-frequency and radio transmission. There is a fair probability of providing a high-speed and low-power-consumption device with ease of integration and enlargement in device area. For example, the FET can also be incorporated as a unit device structure including a part of the photodetector. Furthermore, wide spectrum-range sensitivity can be expected because the essential operation region is near the front surface. In fact, a large number of research results can be confirmed as described below.

For example, a photo-FET having a compound semiconductor-based FET as a basic structure has been developed initially in the GaAs/AlGaAs-based material on a GaAs substrate. However, when GaAs layers are used as buffer layers that act as a channel region for a current pass and also for a light incoming region, the photo-sensitive wavelength is limited up to 850 nm, as described in Document 4 noted below.

Document 4: Hongjoo Song, Hoon Kim, "Analysis of AlGaAs/GaAs Heterojunction Photodetector with a Two-Dimensional Channel Modulated by Gate Voltage," Extended Abstract of the 2003 International Conference on Solid State Device and Materials, Tokyo, 2003, pp. 186-187.

In view of the above, a material containing indium, such as $In_{0.53}Ga_{0.47}As$, InGaAsP, $In_{0.52}Al_{0.48}As$, etc., has been put to use in an effort to ensure a further high speed and an enlargement in a sensitive wavelength range. In the case of InGaAs-based material on an InP substrate, the wavelength range is limited to 2.5 μm even at strained condition. However, an FPA using a photosensitive layer of InSb or InAsSb having sensitivity at a wavelength from 4 to 6 μm has been developed and is being used for thermal-imaging or poisonous-gas sensing.

In GaAs/AlGaAs-based materials, a deep impurity level is induced at the interface between a substrate and an epitaxial layer or between a surface after completion of epitaxial growth and a dielectric insulation film. Further, the GaAs/AlGaAs-based material pins the Fermi level in the vicinity of the midgap. Therefore, carriers are depleted and a semi-insulating layer is formed at the interface. In a material containing indium, in contrast, a conductive layer is liable to be formed on the surface or interface.

In other words, it is required to introduce a donor capable of compensating the influence of a surface level induced at a device interface to obtain conductivity of a channel when a GaAs/AlGaAs-based FET is fabricated. Inversely, it is necessary to suppress the leakage current induced by the conductive layer formed at the surface or interface when an InGaAs/InP-based FET is fabricated.

Since a Schottky barrier is easy to form in InAlAs lattice-matched with InP, an FET using an InGaAs channel on an InP substrate is proposed as described in the below Document 5. Barrier layers sandwiching a channel layer are generally formed of InAlAs. A highest-speed HEMT device has been realized at present based on this material.

Document 5: Yoshimi Yamashita, Akira Endoh, Keisuke Shinohara, Kohki Hikosaka, Toshiaki Matsui, Satoshi Hiyamizu, and Takashi Mimura, "Pseudomorphic $In_{0.52}Al_{0.48}As/In_{0.7}Ga_{0.3}As$ HEMTs with an Ultrahigh for 562 GHz, IEEE ELECTRON DEVICE LETTERS, VOL. 23, NO. 10, P. 573 (OCTOBER 2002).

This device, however, has some drawbacks. Since the InGaAs channel layer that serves as a light-absorbing layer is thin, the absorbing efficiency for the long-wavelength light is not good and an improvement such as waveguide coupling is necessary. The waveguide coupling, in which the device facet is employed as an acceptance surface, requires precise alignment. Furthermore, since a barrier layer of InAlAs reacts with oxygen or moisture in the atmosphere, the device poses a problem from the standpoint of reliability. Another problem is that the threshold value is apt to be instable since impurities in the InAlAs are moved easily.

While Al-free InP is advantageous as a gate material from the viewpoint of reliability, some difficulties remain: a Schottky junction is difficult to form; a leakage current is induced from the surface and from the interface between the substrate and the epitaxial layer.

These problems have already been recognized, and some solutions have been proposed. Document 6 noted below, for example, discloses a photo-FET having an HEMT structure as its fundamental structure, in which the pinning effect exerted on a surface potential in the presence of p-type InAlAs is used to elongate a depletion layer from the surface in a dark state. Thereby, the photo-FET having an HEMT cuts off a source-drain current and induces electrons through the accumulation of holes in the gate region at the time of light illumination to thereby make an attempt to fabricate a photodetector having an amplification function.

Document 6: JP-A 2001-111093.

In addition, Document 7 noted below discloses an improvement in an ordinary FET without bringing consciousness to the construction of a photo-FET, in which a trench is formed to reach an InP substrate to eliminate the influence by conduction defects at the interface between the substrate and an epitaxial layer.

Document 7: JP-A HEI 5-275474.

Furthermore, the current path is restricted using a quantum wire as disclosed in Document 8, proposed by the present inventors, and as disclosed in Documents 9 and 10, noted below. A photo-FET is restricted using a quantum point contact to enhance light detection sensitivity significantly as compared with the background art.

Document 8: JP-A 2005-203428.
Document 9: JP-A 2001-332758.
Document 10: JP-A HEI 9-260711.

Concerned about a photodetector based on a compound semiconductor-based FET structure, excluding a silicon-based one, it is still impossible to obtain a photo-FET having a sufficiently satisfactory optical sensitivity even when the technique disclosed in Document 6 is used along its gist to fabricate a device, which is considered as being excellent in the background art documents. In particular, it is necessary to form a sufficiently thick photo-absorption layer to materialize a front side illuminated photo-FET applicable to an image pickup device. In addition, precaution against a leakage current has not been taken and a leakage current from the edge of the channel width direction orthogonal to the channel length direction has not been suppressed. Even when the trench-digging technique, as disclosed in Document 7, has been incorporated therein, this cannot be effective according to the experiences of the present inventors because the formation of a dielectric insulation film induces leakage of a current through the surface of the trench.

The structures as disclosed in Documents 8, 9, and 10 have to be formed through ultra fine microfabrication technique using the electron beam exposure method. In addition, since a sub-micron photo-lithography machine is necessary to form a current-restricted part as disclosed in Document 10, minute adjustment of a gap spacing is required. It is, as a matter of course, undesirable to require such high accuracy for the device fabrication, because of the large number of steps required and their complexity. Since satisfactory optical sensitivity has not yet been obtained, the background art techniques have not yet reached a level that can sufficiently be advocated in future without any modification. To begin, the quantum structure is not indispensable to the acquirement of a highly sensitive photo-FET.

SUMMARY OF THE INVENTION

The present invention has been accomplished in view of the conventional state of affairs. An object thereof is to provide a photo-FET that is not a silicon-based photodetector as disclosed in Documents 2 and 3. Further, an object is to provide a compound semiconductor-based photodetector that is advantageous for expanding a wavelength range, that can eliminate or alleviate the drawbacks in the background art, that can acquire sufficiently high optical sensitivity even with a device dimension readily producible with an ordinary photolithography machine having resolution of approximately 0.5 μm at most, and that can infallibly suppress a leakage current with a two-dimensional or three-dimensional highly reproducible device structure.

To attain the above and other objects, the present invention proposes a photo-FET having the following configuration as an improvement in a photodetector that is not a silicon-based photodetector with a relatively long photogenerated carrier lifetime, but a compound semiconductor-based photodetector with a short photogenerated carrier lifetime.

To be specific, the compound semiconductor-based photo-FET of the present invention comprises a channel layer formed on a substrate, which constitutes a current path between a source electrode and a drain electrode and serves as part of a photodiode and also as part of a photosensitive region; a substrate-side depletion region formation layer that works as a back-gate layer, which is disposed between the substrate and the channel layer, which forms a homojunction or heterojunction against the channel layer, which elongates a substrate-side depletion layer from the substrate toward the channel layer, and which applies a back-gate bias by photo-generated carriers upon light illumination; a barrier layer disposed on a front side of the channel layer, which has a wider bandgap than the channel layer, and which causes one of the photogenerated carriers to run to the channel layer and the other type of the photogenerated carriers to sojourn or be blocked off; and a front-side depletion layer formation layer disposed on the front side of the channel layer, which elongates a front-side depletion layer from a front side thereof toward the channel layer, and brings the front-side depletion layer into contact with the substrate-side depletion layer in the dark to close the current path in the channel layer, thereby bringing the photo-FET to an off-state.

With the above configuration, the dark current (leakage current) in the dark can be suppressed to a great extent compared with the background FETs to enable the provision of a photo-FET that is relatively easier to fabricate and capable of detecting the leakage current efficiently with illumination.

The present invention further discloses, besides the above structure, a configuration that can be desirably added thereto. To be specific, when designing the carriers running on the channel layer as electrons, the barrier layer is set to have a larger band offset in the valence band than in the conduction band at the interface with the channel layer to thereby provide a photo-FET having only the holes selectively confined at the interface.

The photo-FET can be further desirably configured that the back-gate layer that serves also as the substrate-side depletion layer formation layer has a polarity opposed to that of the majority carriers within the channel layer or is semi-insulating, and has a wider bandgap than the channel layer. In the present invention it may also be desirable that the side surface of the back-gate layer that serves also as the substrate-side depletion layer formation layer is semi-insulating or has the opposed polarity, and has a buried heterostructure embedded with a larger bandgap layer.

Also, the photo-FET may be desirably configured that a graded layer in contact with the lower surface of the channel layer added to the structure so that the band graded structure of the graded layer is utilized to drift photogenerated carriers from the substrate to the front side.

In addition, as another devised configuration that can be suggested, the front-side depletion layer formation layer may be provided with plural openings dotted therein, and one of source and drain electrodes is formed on the front-side depletion layer formation layer so that it may fill all the openings.

As still another devised configuration, the channel layer may be formed with plural blind holes arranged at intervals to at least pass through the channel layer when being seen in the cross-sectional direction, and the parts of the channel layer between the adjacent blind holes are allowed to serve as a current-restricted region via which a current can only pass through the channel layer. With this configuration, the effective sensitivity can be enhanced further. In this configuration, it is better that the front-side depletion layer formation layer also covers the side surface of the layer structure that is exposed to the inner wall surfaces of the blind holes.

As a further embodiment that can structurally prevent a leakage current, a structure can be adopted in which one of the source and drain electrodes is surrounded by the channel layer, whereas the other electrode surrounds the channel layer, when being seen from a plan view.

While the present invention can be applied to a so-called open-gate photo-FET, it can also be applied to a photo-FET provided with a gate electrode. The above configuration may further be provided with a gate electrode constituting a Schottky junction or pn junction, which is disposed halfway between the source and drain electrodes and on the front-side depletion layer formation layer formed on the channel layer. As a matter of course, the presence of the gate electrode enables sensitivity adjustment using a gate bias and exhibition of an output-switching function.

Also, the present invention may be applied to an integrated photodetector including a plurality of such photo-FETs. In this case, the adjacent photo-FETs are preferably separated from each other by a separation trench reaching the substrate. It is also preferable that the wall surface of the trench should be coated with a layer having an opposed polarity to the back-gate layer serving as the substrate-side depletion layer formation layer and having a larger bandgap than the channel layer or the back-gate layer serving as the substrate-side depletion layer formation layer.

While the plural photo-FETs are generally arranged in line-column (two-dimensional matrix arrangement), the present invention can also be applied to the formation of the FET of the same epitaxial layer structure not for photodetection, but for readout in every one line. This makes the formulation of a smart-pixel hybrid integrated circuit easier, which results in great promotion of the development of a small camera with a lock-in detection module having the integrated circuit, a highly sensitive small spectrophotometer, and an optical heterodyne microscope.

BRIEF DESCRIPTION OF THE DRAWINGS

A more complete appreciation of the present invention, and many of the attendant advantages thereof, will be more readily obtained as the same becomes better understood by reference to the following figures.

FIG. 6 is a schematic view showing the configuration of a photo-FET using a current-restricted region formed geometrically to further enhance the optical sensitivity according to a further preferred embodiment of the present invention.

FIG. 7(A) is an explanatory view showing the process operation of determining a current-restricted region in an example of a process for fabricating the photo-FET according to the preferred embodiment shown in FIG. 6.

FIG. 7(B) is an explanatory view showing the process operation of forming a recessed structure in the current-restricted region subsequent to the operation of FIG. 7(A).

FIG. 7(C) is an explanatory view showing the process operation of forming a surface-side depletion layer formation layer subsequent to the operation of FIG. 7(B).

FIG. 7(D) is an explanatory view showing the process operation for vapor evaporation of a gate electrode to be taken when necessary subsequent to the operation of FIG. 7(C).

DESCRIPTION OF THE PREFERRED EMBODIMENTS

The present invention will be described in detail with reference to the accompanying drawings.

Figure 1:
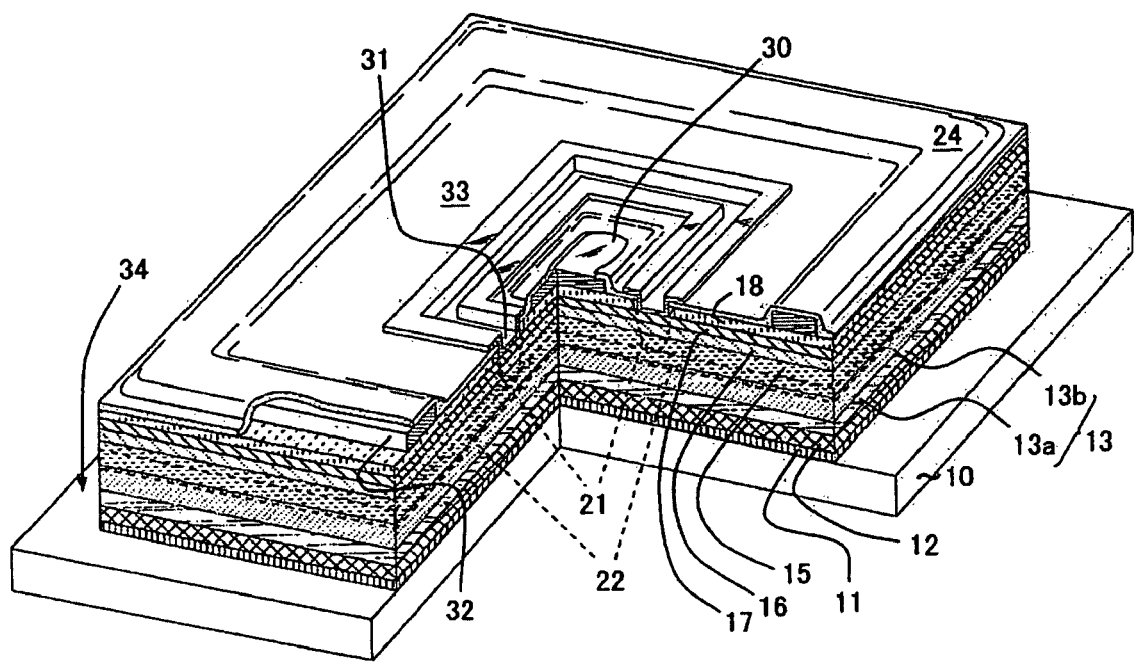
FIG. 1 is a schematic view showing the configuration of a photo-FET using a Schottky barrier according to one preferred embodiment of the present invention.

FIG. 1 shows a preferred embodiment of a photo-FET having a relatively fundamental structure, which has been fabricated according to the present invention.

Generally, in long wavelength semiconductor materials prepared with the MOCVD, an InGaAs—InP-based material used in the near-infrared region of up to a wavelength of 2.5 μm exhibits an n-type background carrier concentration of around $2\times10^{14}$ to $2\times10^{15}$ $cm^{-3}$ due to the influence of residual impurities, and an InSb-based or InAsSb-based material used in the infrared region of up to a wavelength of 6 μm exhibits a background carrier concentration of around $1\times10^{16}$ $cm^{-3}$. On the other hand, to increase the photo-absorption coefficient, a photo-detector is required to have a light-absorbing layer (photosensitive layer) having a thickness of at least 1 to 2 μm. For this reason, it is necessary to deplete a channel beforehand which is conductive at a background level to cut off a channel current in the dark, and at the same time obtain an amplified current corresponding to the photoinduced charge under the illumination. As shown in FIG. 1, in the photo-FET according to this embodiment of the present invention, a p-type doped layer described later is formed from the side of a semi-insulating InP substrate 10 to deplete part of an undoped n-InGaAs channel layer 15. At the same time, a front-side depletion layer 21 prepared by a Schottky junction to be described later surrounds the entire circumference of a source electrode 30, and a conductive path is blocked off also from the front side. This structure will be described in more detail.

The structure per se of a compound semiconductor has already been known for a channel layer constituting a current path between a source and a drain electrode that is set into the turn-on-state (conduction state) under illumination, forming part of a photodiode and photosensitive region, and also sandwiched with the upper and lower heterojunction layers having a wider bandgap than the channel layer. As in the embodiment of the present invention shown in FIG. 1, however, when it is intended that the undoped InGaAs channel layer 15 is formed on an InP or InAlGaAs buffer layer 12 on the semi-insulating InP substrate doped with Fe, irrespective of the presence of the intention, an n-altered layer 11 exhibiting electron conduction is possibly formed on the surface of the substrate 10 as an underlayer for the buffer layer 12 thereon.

In the background structure, the formation of such layer 11 has produced one of the causes of inducing a leakage current along the lower side of the channel layer 15. In this connection, the embodiment of the present invention shown in FIG. 1 forms the InP buffer layer 12 on the n-altered layer 11 first and then a p-InAlGaAs substrate-side depletion layer formation layer that serves also as a back-gate layer 13 as described later. Though the back-gate layer 13 serving also as the substrate-side depletion layer formation layer provided for the purpose of intentionally growing a depletion layer from the substrate side may have a single layer structure, it preferably has a two-layer structure 13a and 13b as shown, which comprises a p-InAlGaAs layer 13a formed on the InP buffer layer 11 and a p-InGaAs layer 13b formed thereon.

When the back-gate layer 13 serving also as the substrate-side depletion layer formation layer is constituted by a single layer of the p-InAlGaAs layer 13a and a hetero pn junction is formed between it and the channel layer 15, the positive charge produced by the residual impurities in the n-altered layer 11 and the undoped InGaAs channel layer 15 is compensated for the negative charge produced by an ionized acceptor, thereby depleting the channel layer 15 from the side of the substrate 10. A back-gate bias of the surface FET can be applied (modulated) by accumulating holes, which are generated in the channel layer and the substrate-side depletion layer formation layer under illumination, under the gate and within the back-gate layer 13 serving also as the substrate-side depletion layer formation layer. As mentioned above, the p-InAlGaAs back-gate layer 13 (13a) serving also as the substrate-side depletion layer formation layer depletes the electrons in the vicinity of the substrate irrespective of the presence of the n-altered layer, and it prevents a leakage current from the bottom surface of the channel layer 15 that works as a photosensitive region. In addition, it controls the depth of the depletion layer 22 extending downward of the channel layer 15 toward the substrate 10.

A similar action can be expected to set the threshold voltage of the FET independently while securing the thickness of the light-absorbing layer, even when the p-InGaAs back-gate layer 13b serving also as the substrate-side depletion layer formation layer alone is employed. The reason why the two-layer 13a, 13b stacked structure is adopted is that a barrier against electrons and holes can be greatly enhanced with the presence of the p-InAlGaAs back-gate layer 13a serving also as the substrate-side depletion layer formation layer. Layer 13a forms a heterojunction relative to the p-InGaAs back-gate layer 13b serving also as the substrate-side depletion layer formation layer that forms a homo pn junction relative to the channel layer 15.

Subsequent MOCVD epitaxial growth is continued on the back-gate layer 13 having a single-layer or stacked structure and serving also as the substrate-side depletion layer formation layer in the photo-FET as shown in FIG. 1. That results in the formation of the undoped InGaAs channel layer 15 serving also as a photosensitive layer with a thickness of around 0.5 to 1 µm, an undoped InP barrier layer 16 with a thickness of around 50 nm, an undoped InAlGaAs layer 17 that is an etch-stop layer 17 serving also as a Schottky contact formation layer with a thickness of around 50 nm, and an n-InP modulation-doped layer 18 with a thickness of around 50 nm.

On the resultant multilayer, a drain electrode 32 made of a proper ohmic metal material by an existing technique, such as AuGe/Ni/Au, is disposed so as to surround a source electrode 30 shown at the center of FIG. 1 at a prescribed distance. In the fabrication process, after these electrodes 30 and 32 are formed, a dielectric film 24 of $SiO_2$ or $SiN_x$ is formed by plasma enhanced CVD or the like, a spacing on which a gate electrode is to be formed is exposed by selective dry etching so as to surround the source electrode 30, and selective etching using an InP selective etchant, such as a hydrochloric acid or tartaric acid-based etchant, is utilized to selectively remove the n-InP modulation-doped layer 18. With this, since the trench in the n-InP modulation-doped layer 18 is enlarged toward the lateral direction at a recess etching, a gate electrode 31 disposed to surround the source electrode 30 can be brought into contact with the etch-stop layer 17 serving also as a Schottky contact layer while avoiding its side contact with the n-InP modulation-doped layer 18 having high conductivity. The gate electrode 31 may be formed of Ti/Pt/Au, for example.

Thus, the trench is dug by etching, and the portion of the etch-stop layer 17 deprived of the upper n-InP modulation-doped layer 18 serving also as the Schottky contact layer and the etch stop layer constitutes the front-side depletion layer formation region that produces a front-side depletion layer 21. In this connection, the etch-stop layer 17 serving also as the Schottky contact layer can also be referred to as a front-side depletion layer formation layer 17. Though the gate electrode 31 is formed on the front-side depletion layer formation region of the front-side depletion layer formation layer 17 in this embodiment, a portion deprived by etching of the n-InP modulation-doped layer 18 is formed in the etch-stop layer 17 serving also as the Schottky contact formation layer and used as the front-side depletion layer formation layer in the case that the electric operation characteristics are unnecessary to adjust by gate potential. The photo-FET can fulfill its function even in the absence of the gate electrode 31, as a so-called "open-gate FET," since the front-side depletion layer 21 is spread deeply within the channel layer 15 as shown in FIG. 1. In other words, this is one factor in the present invention in which the front-side depletion layer formation region for elongating the front-side depletion layer in the depth direction of the channel is disposed halfway along the channel-length between the source electrode 30 and the drain electrode 32. It is the question in accordance with the request in use whether the gate electrode 31 should be disposed there or not.

Though it is relatively easy to form a Schottky barrier on the channel layer 15, a pn junction can be used instead comprising an undoped n-type channel layer and a stacked structure of p-InAlGaAs and p-InGaAs because it is superior in a relatively small surface-leakage current.

Figure 2:
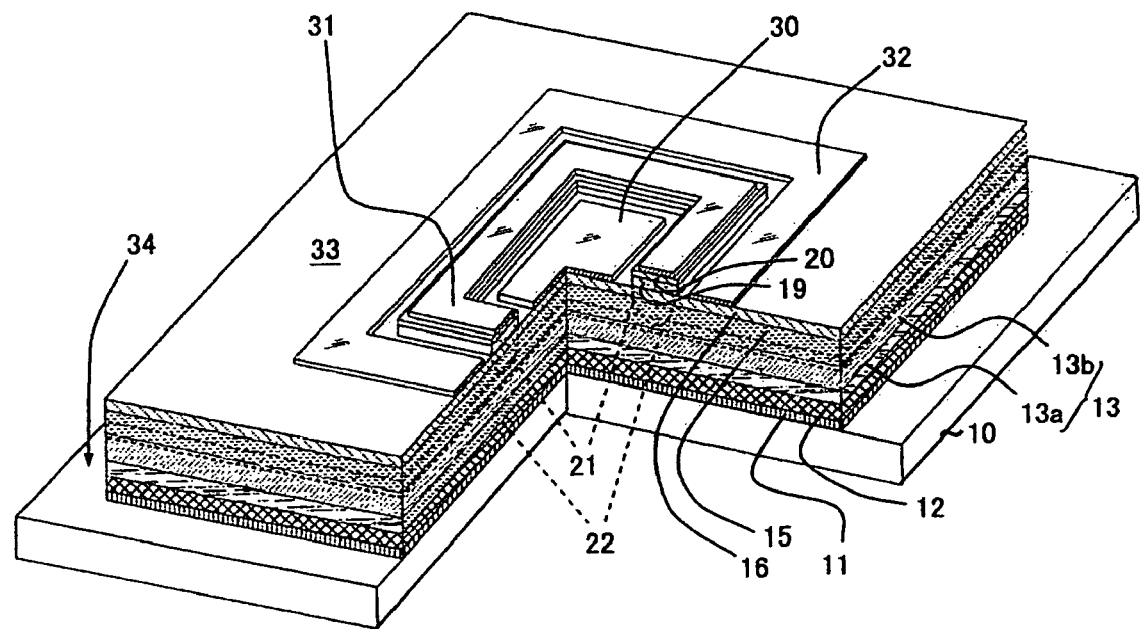
FIG. 2 is a schematic view showing the configuration of a photo-FET using a pn junction according to another preferred embodiment of the present invention.

This alternative is shown as another embodiment of the present invention in FIG. 2. The description used in the embodiment shown in FIG. 1 is applicable to the embodiment of FIG. 2, and a redundant description is thus omitted. In the embodiment shown in FIG. 2, after forming the undoped InGaAs channel layer 15 and the undoped InP barrier layer 16 in the same manner as in the photo-FET shown in FIG. 1, a front-side depletion layer formation layer 19, the function of which will be described later in detail, is continuously formed to a thickness of around 150 nm. As shown, this layer 19 remains only under the gate electrode 31 in the final configuration. In other words, the lower surface of this layer 19 will constitute the surface-side depletion layer formation region.

A p-doped InGaAs cap layer 20 in a thickness of around 20 nm is formed on the front-side depletion layer formation layer 19. This layer 20 has the effects of making the wet etching process easily reproducible by enhancing the adhesion of a photoresist and by preventing the formation of an oxide film, and lowering the ohmic contact resistance. There may be a case in which the front-side depletion layer formation layer 19 of InAlGaAs should preferably be a layer having a composition excluding Ga, i.e. a layer of InAlAs.

In the fabrication process of a photo-FET shown in FIG. 2, the p-doped InGaAs cap layer 20 and the front-side depletion formation layer 19 of p-InAlGaAs are selectively etched with a phosphoric acid and hydrogen peroxide-based selective etchant that is a selective etchant for InGaAs to leave or preserve a shape of a rectangular frame. Thereafter, the source electrode 30 that will be surrounded by the gate electrode 31 and the drain electrode 32 that will surround the gate electrode 31 both made of a suitable electrode material, such as AuGe/Ni/Au for example, are formed in the vicinity of the p-doped InGaAs cap layer 20 and p-InAlGaAs front-side depletion layer formation layer 19, by vapor deposition with the self-alignment technique and lift-off process, for example. Furthermore, an alloying treatment can be performed in nitrogen at 400° C. for around one minute to secure the ohmic characteristics. The gate electrode 31 is then formed on the p-doped InGaAs cap layer 20 from a suitable metal material, such as Ti/Au, for example.

In the photo-FET having the structure as shown in FIG. 2, due to the presence of the back-gate layer 13 serving also as the substrate-side depletion layer formation layer intentionally formed on the channel layer 15 which is the photosensitive layer, a substrate-side depletion layer 22 reaches the surface of the photo-FET to deplete the electrons. For this reason, for the FET to prevent the channel current from being blocked off, the drain and source electrodes 30 and 32 should be as close to the gate electrode 31 as possible.

As described earlier, the structure can be modified to an open-gate structure, and in this case, the formation of the front-side depletion formation layer 19 alone will suffice without need to form thereon the cap layer 20 and gate electrode 31.

The photo-FET of the present invention thus fabricated has a configuration in which, when seen from a plan view, the front-side depletion layer 21 produced either by the Schottky junction (in the embodiment of FIG. 1) or by the pn junction (in the embodiment of FIG. 2) surrounds the entire circumference of the source electrode 30 and the gate electrode is formed on the front surface of the front-side depletion layer 21.

When using the pn junction, however, the gate electrode 31 made of a suitable metal is not required to fully surround the source electrode 30, but will sufficiently fulfill its function if at least part thereof is connected to the surface-side depletion layer formation layer 19 and to the p-doped InGaAs cap layer 20. In addition, while the drain electrode 32 when seen from a plan view also surrounds the gate electrode 31 or the front-side depletion layer formation region, it has no problem when being devoid of part thereof similarly to the gate electrode 31. This point is applicable to the photo-FET according to the embodiment shown in FIG. 1, and by avoiding a perfectly closed curve shape, generation of small metal strips otherwise produced during the lift-off process for a metal electrode can be suppressed.

For the integration of these photo-FET devices, the outer periphery of each photo-FET is etched to form a trench reaching to the semi-insulating InP substrate 10 to be separated from the adjacent devices.

In the embodiment shown in FIG. 1, since n-InP modulation-doped layer 18 covers the entire area of the device, the parasitic resistance can be suppressed. In addition, generally a Schottky barrier is easier to produce, but its leakage current and temporal stability are prone to be inferior to those of a pn junction. On the other hand, in the photo-FET shown in FIG. 2, since the gate junction is a pn junction, the gate leakage current can be suppressed. However, since the source and drain junction comes into ohmic contact directly with the undoped InP barrier layer 16, the parasitic resistance has a tendency to increase. Furthermore, for the FET to prevent a channel current from being blocked off, as described earlier, the drain electrode 32 and source electrode 30 are as close to the gate electrode 31 as possible. In addition, in both the embodiments shown in FIGS. 1 and 2, there is a case where the etched end facets formed after separating the devices may possibly produce a cause of allowing a leakage current to be induced.

Figure 3:
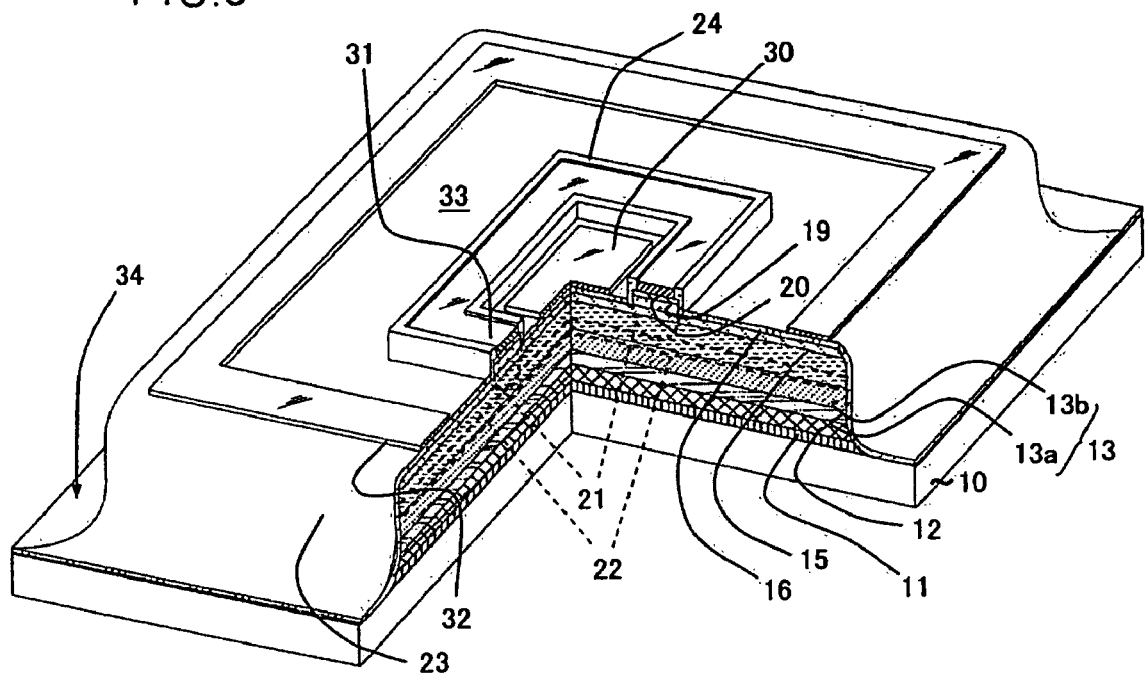
FIG. 3 is a schematic view showing the configuration of a photo-FET using a re-grown side surface-buried heterostructure layer according to still another preferred embodiment of the present invention.

Though even the embodiments shown in FIGS. 1 and 2 offer excellent characteristics in comparison with the background art devices, certain drawbacks in these embodiments can be solved by adopting a configuration of the device shown in FIG. 3. To be specific, inner and outer peripheral parts of a front-side depletion layer formation layer 19 identical with the p-InAlGaAs surface-side depletion layer formation layer 19 in the embodiment of FIG. 2 are surrounded like a rectangular frame by a suitable thin dielectric film 24, and almost the entire area of the device excluding the thin film 24 is coated with an n-InP layer 23 re-grown selectively by the MOCVD. Then, the gate electrode 31 is formed where part of the thin film 24 is removed, and the source and drain electrodes 30 and 32 are formed on the n-InP layer 23. By so doing, while the pn junction excellent in junction characteristic is used in the gate region, the resistance of the device is reduced because the surface of the device is coated with the n-InP layer 23 that allows infrared permeability and conductivity.

In addition, since the InGaAs channel layer (photosensitive layer) 15 at the side wall of the device is coated with the n-InP layer 23 having a wide bandgap, it becomes possible to provide a buried heterostructure photo-FET, where the carrier recombination is suppressed at the facet thereof. In addition, the p-InGaAs back-gate layer 13b serving also as the substrate-side depletion layer formation layer and the p-InAlGaAs back-gate layer 13a serving also as the substrate-side depletion layer formation layer are separated by the reverse-biased pn junction as isolated wells within the device. Incidentally, the substrate 10 may have an n-type conductivity when the InP buffer layer 12 has been formed relatively thick around 0.5 μm. In the present embodiment of FIG. 3, since the InP re-grown layer 23 maintains the conduction state between the surface of the device and the substrate 10, use of an n-type substrate enables the drain electrode 32 to be omitted and makes it advantageous to achieve integration of a minute pixel array.

The photo-FET having the configuration shown in FIG. 3 can adopt an open-gate structure. In this case, neither the cap layer 20 on the front-side depletion layer formation layer 19 nor the gate electrode 31 is required.

Figure 4A:
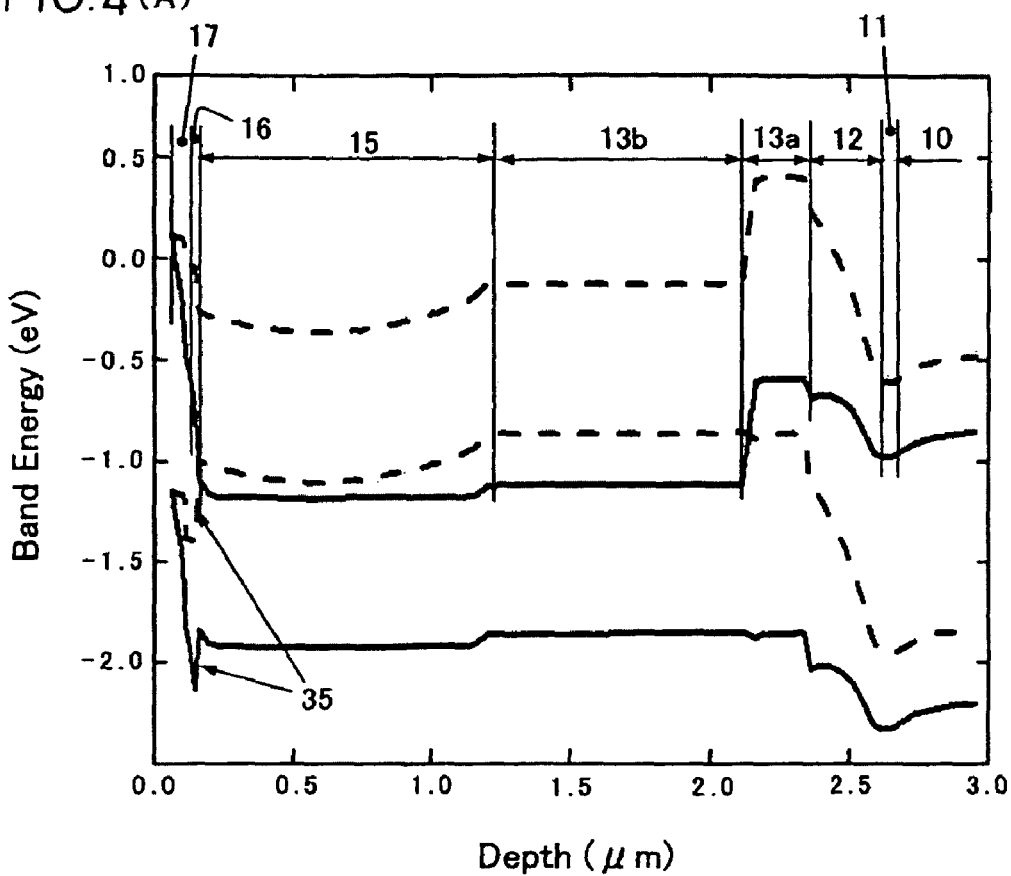
FIG. 4(A) is an explanatory view showing a band profile in the depth direction of the photo-FET of the present invention in FIG. 1, which includes the surface-side depletion layer.
Figure 4B:
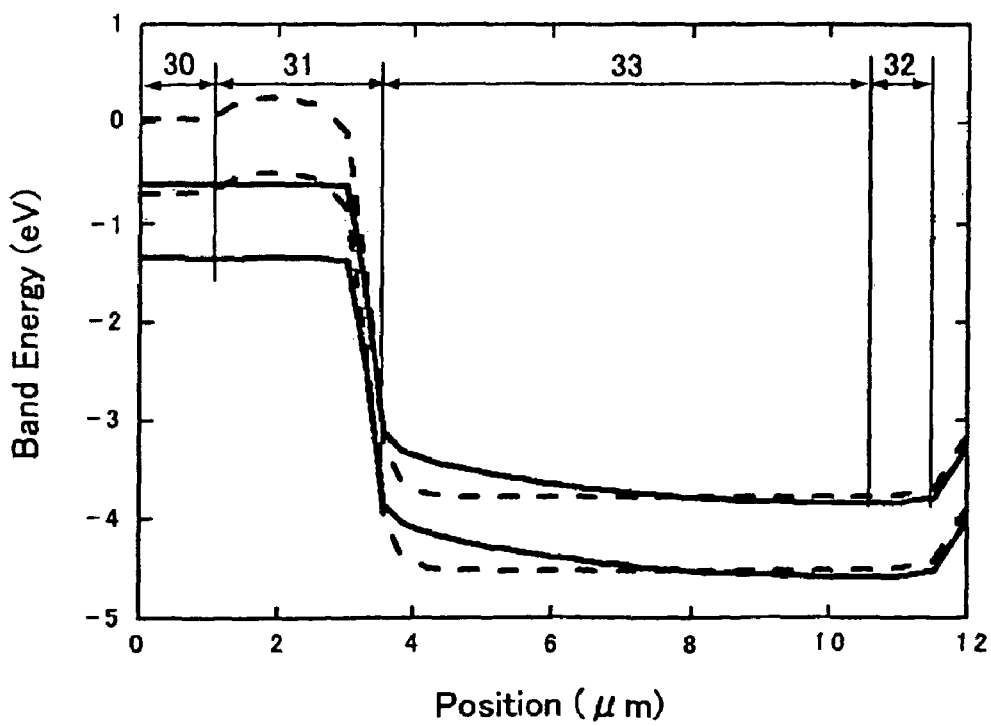
FIG. 4(B) is an explanatory view showing a band profile in the channel length direction of the photo-FET shown in FIG. 1.

FIGS. 4(A) and 4(B) show the operation principle of the photo-FET of the present invention shown in FIG. 1. FIG. 4(A) shows a band profile obtained through the simulation in the depth direction across the surface-side depletion layer 21. FIG. 4(B) shows a band profile along the channel length direction.

The solid line shows the band profile obtained when the device has been illuminated at 1 W/cm$^2$, and the dashed line shows the band profile obtained in the dark, respectively. The InGaAs channel layer 15 is sandwiched between the combination of the InAlGaAs etch-stop layer serving also as the Schottky contact formation layer (front-side depletion layer formation layer) 17 and InP barrier layer 16, and the combination of the p-InGaAs back-gate layer 13b serving also as the substrate-side depletion layer formation layer and the p-InAlGaAs back-gate layer 13a serving also as the substrate-side depletion layer formation layer. In this case, though the back-gate layer 13 serving also as the substrate-side depletion layer formation layer has a stacked structure, a partial region thereof that is the p-InAlGaAs back-gate layer 13a serving also as the substrate-side depletion layer formation layer and constituting the substrate side layer has a sufficiently larger bandgap than the channel layer 15.

The thickness of each of the undoped InAlGaAs layer 17 and the InP barrier layer 16 may be 50 nm. The undoped InGaAs channel layer 15 may have an n-type background impurity of $2 \times 10^{14}$ cm$^{-3}$ and a thickness of 1 μm. The p-InGaAs back-gate layer 13b serving also as the substrate-side depletion layer formation layer may have a doping concentration of $1 \times 10^{17}$ cm$^{-3}$ and a thickness of 1 μm. The p-InAlGaAs back-gate layer 13a serving also as the substrate-side depletion layer formation layer may have a doping concentration of $1 \times 10^{17}$ cm$^{-3}$ and a thickness of 0.2 μm.

In the configuration of the present invention, as shown, the photo-FET can be brought to a complete OFF-state in the dark. In fact, the photo-FET yields satisfactory results that the residual impurity concentration in each layer is finely adjusted in view of the state of electrical charge at the device surface and at the interface between the substrate and the epitaxial layer in every device to be fabricated.

In consequence of illuminating the device, holes having a polarity opposed to that of majority carriers are accumulated at the portions of the interface between the undoped InP barrier layer 16 and the channel layer 15 under the front-side depletion layer formation layer 17 that is the etch-stop layer serving also as the Schottky contact layer formation layer or under the gate electrode 31, resulting in shrinking the front-side depletion layer 21 upward. At the same time, electrons are diffused toward the channel layer from the p-InAlGaAs back-gate layer 13a layer serving also as the substrate-side depletion layer formation layer and from the p-InGaAs back-gate layer 13b serving also as the substrate-side depletion layer formation layer as minority carriers, and holes produced in the channel layer 15 flow into the p-InGaAs back-gate layer 13b serving also as the substrate-side depletion layer formation layer to effectively apply a back-gate bias to positively bias the entirety, to thereby similarly shorten the front-side and substrate-side depletion layers 21 and 22. As a result, a gap is formed between the front-side and substrate-side depletion layers 21 and 22 to form a so-called channel-opened state. The channel-opened state induces an electron current between the source and drain electrodes 30 and 32 to fulfill the light-detecting function.

Actually, the conduction band of the InGaAs channel layer 15 has a local minimum point at 0.14 V in the dark, whereas the voltage at the InGaAs channel layer 15 and the p-InGaAs back-gate layer 13b serving also as the substrate-side depletion layer formation layer is flat and is lowered to −0.68 V under illumination. That is to say, the light illumination is equivalent to the application of a back-gate bias voltage at 0.82 V from the substrate side to increase the source-drain current in accordance with the transfer conductance of the FET.

Meanwhile, as a material lattice-matched with In$_{0.53}$Ga$_{0.47}$As and having a large bandgap, InP and In$_{0.52}$Al$_{0.48}$As can be raised. However, due to their difference in electron affinity, the band offset in the conduction band and the valence band is distributed at a ratio of 40%:60% at the interface between In$_{0.53}$Ga$_{0.47}$As and InP, and at a ratio of approximately 70%:30% at the interface between In$_{0.53}$Ga$_{0.47}$As and InAlAs or InAlGaAs, respectively, as described in Document 11 below.

Document 11: "Properties of Lattice-matched and Strained Indium Gallium Arsenide," p. 86, edited by Pallab Bhattacharya, INSPEC, the Institution of Electrical Engineers, London, United Kingdom.

That is to say, InAlGaAs constitutes a higher barrier relative to the electrons, whereas the interface with InP has a larger confinement effect relative to the holes.

In the material system using GaAs as a substrate, InGaP is preferred as a material constituting a hetero barrier rather than AlGaAs. This is because electrons can freely flow through the conduction band offset, while a high barrier is formed relative to the holes as is similar in the previously-mentioned InGaAs/InP system. The band offset in the conduction band is 0.06 eV, while that in the valence band is 0.40 eV as described in Document 12 below, since the energy bandgap of In$_{0.5}$Ga$_{0.5}$P and GaAs is distributed at a ratio of 13% toward the conduction band side and at a ratio of 87% toward the valence band side. A similar tendency is taught in Document 13 listed below.

Also, In$_{0.2}$Ga$_{0.8}$As can be used instead of the GaAs channel if a certain degree of distortion is permitted in the GaAs system. As a result, the mobility of the channel electrons is enhanced, and the barrier relative to the holes is further strengthened. To materialize the configuration of FIG. 1 disposed on a GaAs substrate, a semi-insulating GaAs substrate 10 may be used as the substrate 10, a GaAs buffer layer 12 as the buffer layer 12, an undoped InGaP barrier layer 16 as the barrier layer 16, an undoped AlGaAs etch-stop layer 17 serving also as a Schottky contact layer as the etch-stop layer 17 serving also as the Schottky contact layer, and an n-InGaP modulation-doped layer 18 as the modulation-doped layer 18.

Document 12: Kwan-Shik Kim, Yong-Hoon Cho, and Bryng-Doo Choi, "Determination of Al mole fraction for null conduction band offset in In$_{0.5}$Ga$_{0.5}$P/Al$_x$Ga$_{1-x}$As heterojunction by photoluminescence measurement," Appl. Phys. Lett., 67 (12), 18 Sep. 1995.

Document 13: Jianhui Chen, J. R. Sites, I. L. Spain M. J. Hafich and G. Y. Robinson, "Band offset of GaAs/In$_{0.48}$Ga$_{0.52}$P measured under hydrostatic pressure," Appl. Phys. Lett., Vol. 58, No. 7, pp. 1719-1720, 18 Feb. 1991.

As described in the foregoing, an FPA using InSb and InAsSb having sensitivity at a wavelength of 4 to 7 μm for a photosensitive layer has also been developed and is ready for use for thermal image sensing and poisonous gas sensing.

Particularly, InAsSb has a band absorption edge of 3 μm (Sb composition: 0.07) to 8.5 μm (Sb composition: 0.6) depending on the composition ratio of Sb to As, as described in Document 14 noted below. While the fundamental absorption wavelength of CO is 4.65 μm, for example, an InAsSb-based device can advantageously be used in a cooled condition that can be realized with a peltiert device through the selection of a composition corresponding to a shorter wavelength in accordance with the intended use, unlike an InSb (7.3 μm) device that is required to cool down at around the liquid nitrogen temperature of 77 K. It is conceivable to use AlAsSb and InAsP-based alloys as a barrier layer when fabricating a photo-FET using InAsSb as a photosensitive layer (channel layer). An InAsP is preferred against InAsSb as the barrier layer to enhance the confinement effect of holes similarly to GaAs/InGaP-based alloy or InP/InGaAs-based alloy system.

Document 14: Z. M. Fang, K. Y. Ma, D. H. Jaw, R. M. Cohen, and G. B. Stringfellow, "Photoluminescence of InSb, InAs, and InAsSb grown by organometallic vapor phase epitaxy," J. Appl. Phys. Vol. 67, No. 11, pp. 7034-7039, 1 Jun. 1990.

In short, it is effective to use a hetero barrier having the transmission of holes made lower than the transmission of electrons to the channel layer 15 constituting the photosensitive region. In other words, the hetero barrier having the valence band offset made larger than the conduction band offset at the interface with the channel layer 15 is mounted on the channel layer 15. As a result, it becomes possible to obtain a desirable gain by keeping the generated holes selectively within the epitaxial layer.

Returning to FIG. 4(A), since a hetero barrier structure 35 permitting electrons to pass through but making holes difficult to pass therethrough is provided at the interface between the InP barrier layer 16 and the InGaAs channel layer 15, it is found that the barrier against the holes is left behind while the barrier against the electrons has been removed under the illumination. FIG. 4(B) shows, as described above, the band profile of the channel layer 15 along the gate electrode 31, photosensitive layer 33, and drain electrode 32 which are arranged in the direction of outward from the source electrode 30, in which the source gate voltage and drain voltage have been set to be 0 V and 4 V, respectively. In the dark shown by the dashed line, transport of the electrons from the source to the drain is prevented since the front-side depletion layer 21 (FIG. 1) is formed by the Schottky gate. On the other hand, under the illumination shown by the solid line, the band is lowered as a whole, and the barrier against the electrons disappears at the same time. Incidentally, in the present embodiment, since the front-side depletion layer 21 encloses the entire periphery of the source electrode 30 with a closed rectangular shape when seen from a plan view, this ultimately means that the channel layer 15 can be blocked halfway along the current path between the drain electrode 32 and the source electrode 30, resulting in extremely effective suppression of an electron current (dark current) between the source and drain electrodes.

In addition, in the present embodiment having the planar structure in which the drain electrode 32 per se surrounds the source electrode 30, since the channel layer 15 is neither exposed nor connected at the opposite ends thereof to any other portion or layer than the source and drain electrodes 30 and 32, the planar structure also has a geometric structure in which the current capable of selectively flowing within the device does not leak out to other external circuits. Since the channel is invariably connected at any place of one end thereof to the drain electrode 32 and at any place of the other end thereof only to the source electrode 30, there is no other path for connection. In other words, the channel layer 15 between the source and the drain is blocked off in the region halfway along the current path by the front-side depletion layer 21 or both the front-side depletion layer 21 and the substrate-side depletion layer 22.

Holes are effectively accumulated toward the center of the device under a drift field applied from the drain electrode 32 via the photosensitive region 33 to the gate region 31 and the source region 30 by positively applying a drain voltage. It can be understood from the band profiles of the device shown in FIGS. 4(A) and 4(B) that the photosensitivity is made sufficiently high according to this mechanism.

The portion of the band profile rising at the surface side enables the holes generated through illumination in the vicinity of the InGaAs channel layer 15 to drift toward the surface side and the electrons to move toward the middle of the channel in the opposite direction of the holes. As a result, the electrons can be accumulated in the middle of the InGaAs channel layer 15, at the holes at the interface between the InP barrier layer 16 and the channel layer 15, and at the p-InGaAs substrate-side depletion layer formation film 13b. That is to say, the region in which the photogenerated minority carriers are accumulated and the running path for the majority carriers are separated from each other in the depth direction while they are overlapping with each other when seen from a plan view.

Consequently, it is equivalent to the condition that the junction FET gate is kept in a positively biased state during the accumulation of the holes, and the depletion layers 21 and 22 in the vicinity of the buffer layer interface are shrunk to increase the current density. In such a configuration of the present invention, since the spatial distribution of the holes and that of the electrons are separated from each other in the cross-sectional direction (depth direction) of the device while they are overlapping with each other from a plan view, as described above, the carrier recombination is suppressed and the carrier lifetime increases. Particularly, since the holes generated in the configuration of the present invention are selectively blocked at the interface between the InP barrier layer 16 and the InGaAs channel layer 15 by the hetero barrier structure 35 at the interface, they are accumulated in the front-side depletion layer 21 (directly below the gate electrode 31 or directly below the front-side depletion layer formation region marked as the etch-stop layer 17 serving also as the Schottky contact formation layer) to locally open the channel under the front-side depletion layer. Since the sensitivity of the photo-FET is determined by the ratio of the photogenerated charge sojourn time to the electron transit time, the photosensitivity can be greatly enhanced by prolonging the hole recombination lifetime by making the spatial overlapping small between the electrons and the holes and the hetero barrier high in the valence band to block the hole dissipation path selectively, although in that case the speed of response will be reduced to several to several tens of μs. Furthermore, since the active portion of the present device can also be disposed on a very shallow surface (to a depth within 100 nm), the device can exhibit high sensitivity not only in the infrared region, but also in the ultraviolet region.

Also, $In_{0.52}Al_{0.48}As$ having the Al composition of 0.48 forms a steep conduction band profile and is advantageous in performance. However, since it tends to be spontaneously oxidized to deteriorate the device performance, there is a case where a dielectric film has to be deposited to protect the device surface. In view of this, $In_{0.52}Al_{0.18}Ga_{0.18}As$ having the Al composition reduced to 0.3 can be used to improve the reliability. Even when the $In_{0.52}Al_{0.3}Ga_{0.18}As$ is employed, performance of the photo-FET can sufficiently be satisfied since the conduction band offset of around 0.3 eV relative to $In_{0.53}Ga_{0.47}As$ can be secured. When the InAlGaAs is used as the material for the front-side depletion layer formation layer 17, the same material is preferably used for the back-gate layer 13 serving also as the substrate-side depletion layer formation layer to simplify setting of crystal growth conditions. This configuration can be adopted in the embodiment shown in FIG. 1. There is also no problem if the Al composition of the respective materials of InAlGaAs is changed or a single layer of InAlAs is used.

In the embodiment shown in FIG. 1, undoped InGaAs can be used as the material for the channel layer 15. This is because it is desirable to reduce scattering factors as much as possible and not to introduce any impurity intentionally (to keep it up to a background n-type) to enhance the electron mobility. Though in the molecular beam epitaxy (MBE) a background dopant is of p-type in the presence of a carbon impurity, the barrier layer 16 or n-InP layer 18 should be modulation doped to adjust the channel conductivity without introducing any impurity in the channel intentionally. Incidentally, in this case it can be interpreted that the substrate-side depletion layer formation layer 13 is spontaneously formed. It is also possible to use a semi-insulating semiconductor having Fe having a deeper impurity level added thereto in place of the InP buffer layer 12.

Furthermore, in the embodiment shown in FIG. 1, though the surface potential is fixed by the Schottky barrier-type gate electrode 31, an open gate photo-FET without having the gate electrode 31 can be constructed from the devices in the embodiments shown in FIGS. 2 and 3. Also, as the surface potential is freed in this case, the sensitivity is enhanced by around twice in comparison with the case in which the gate electrode 31 is fixed in potential, by adjusting the thickness of the channel layer 15, the position of the front-side depletion layer formation region, and the position of the substrate-side depletion layer formation layer in accordance with the impurity concentration of the channel layer 15.

Figure 5:
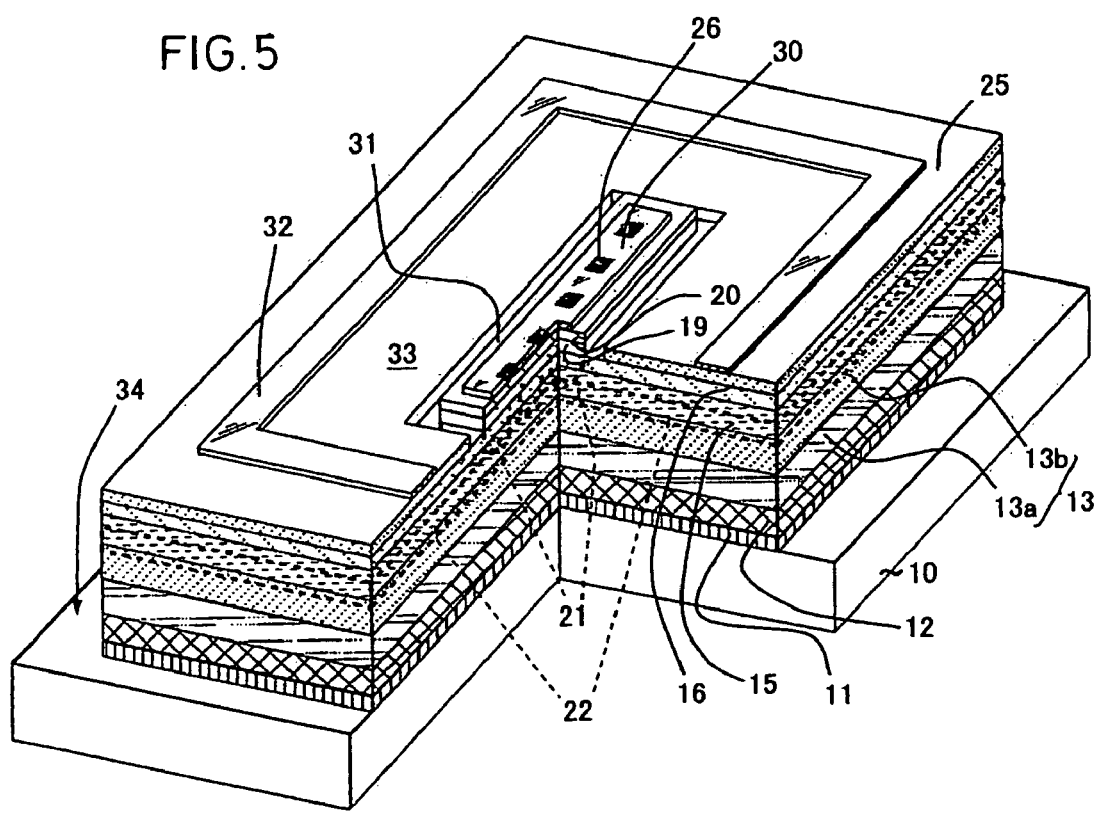
FIG. 5 is a schematic view showing the configuration of a photo-FET having a front-side depletion layer formation layer with an opening according to yet another preferred embodiment of the present invention.

FIG. 5 illustrates still another embodiment of the present invention. Features thereof are that the source electrode 30 and the front-side depletion layer formation layer 19 having plural openings 26 formed therein at prescribed intervals are disposed on the center of the device. When seen from a plan view electrode 30 and depletion layer formation layer 19 are also in contact with each other. The source electrode 30 is surrounded over its entire circumference by the front-side depletion layer formation layer 19 that is surrounded by the drain electrode 32 formed in the shape of a frame and that the source electrode 30 is also surrounded entirely by the drain electrode 32 when seen from a plan view. In this structure, the source electrode 30 is in contact with the etch-stop layer 16 serving also as the undoped InP barrier layer, the p-InGaAs cap layer 20, and the p-InAlGaAs front-side depletion layer formation film 19, and the gate electrode is connected to the source electrode. In addition, the drain electrode 32 is connected via an ITO film 25 that is made close to the front-side depletion layer formation film 19 to secure the conductivity of the FET channel. The description of the preceding embodiments can be applied to other portions.

Also, in the device structure of the present embodiment of FIG. 5, the source electrode 30 is surrounded over its entire circumference by the surface-side depletion layer formation layer 19 and by the channel layer 15, and the front-side depletion layer formation layer 19 is interposed between the source and drain electrodes 30 and 32 and disposed halfway through the current path of the channel layer 15. These points are the same as in the preceding embodiments, and the operation and effects thereof can be expected similarly to the preceding embodiments. That is to say, the surface-side depletion layer 21 elongating into the channel layer 15 without illumination can completely cut off the current path between the source and drain electrodes 30 and 32.

Furthermore, in the photo-FET of the present embodiment of FIG. 5, a further desirable effect is acquired. To be specific, when forming plural devices on the same substrate, though there is a case that boundaries between the devices are slightly unclear, the area of the front-side depletion layer formation layer 19 having the openings in which hole charges are accumulated can be relatively small and enhance the photosensitivity.

FIG. 6 shows yet another embodiment of the present invention that is an example of a device structure using a geometrically formed current restricted region 38 to further enhance the photosensitivity, and FIG. 7 shows an example of the fabrication process thereof.

The description will be made in line with a concrete fabrication example. On a Fe-doped semi-insulating InP substrate 10 or on an n-altered layer 11 spontaneously formed thereon, sequentially formed by the MOCVD are an around 50 nm-thick back-gate layer 13 serving also as a substrate-side depletion layer formation layer formed of a semi-insulating or p-InP separating layer, an around 0.5 μm-thick InP buffer layer 14, an around 1 μm-thick undoped InGaAsP graded layer 27, an around 10 nm-thick undoped InGaAs channel layer 15, an around 15 nm-thick undoped InP spacer layer 28, an around 5 nm-thick n-InP modulation doped layer 29, an around 25 nm-thick undoped InP barrier layer 16, and an around 20 nm-thick n$^+$InGaAs contact layer 39. The back-gate layer 13 serving also as a substrate-side depletion layer formation layer formed of the semi-insulating or p-InP separating layer comes into electrical contact with the lower side (substrate side) of the channel layer 15. The connection between the back-gate layer 13 and the channel layer 15 has been established via the undoped InGaAsP graded layer 27 and InP buffer layer 14, and the undoped InGaAsP graded layer 27 has an effect of spreading a depletion layer irrespective of a conduction type. Specifically, the merit of adding this layer 30 is to retain device characteristics against fluctuations in material characteristics. However, the same device structure as in FIG. 1 may be adopted as the fundamental epitaxial layer structure in the present embodiment. Similarly, in the present embodiment, the undoped InP barrier layer 16 is also electrically connected to the channel layer 15 via the undoped InP spacer layer 28 and n-InP modulation doped layer 29.

In the layer structure of the present embodiment of FIG. 6, as shown in FIG. 7(A), plural elliptical blind holes 37 each having a width of 1.5 μm and a length of 3 μm are formed at an appropriate interval, e.g. at an interval of around 0.2 to 0.5 μm, so as to pass through at least the channel layer 15 in the cross-sectional direction, using a Br$_2$/HBr-based non-selective etchant, for example. The portions between the blind holes 37 and 37 adjacent to each other are determined as current restricted regions 38 to regulate an electric current so that it may flow within the channel layer 15 only via the current restricted regions 38. A dry etching using HI and hydrogen gas and a wet etching can be used together to further refine the current-restricted regions 38. This is advantageous to enhance the current restriction effect.

Next, as shown in FIG. 7(B), an n$^+$InGaAs contact layer 39 on the surface of the current restriction region 38 is removed using a selective etchant based on phosphoric acid and hydrogen peroxide to form a recess (groove) structure 36 in the current-restricted region 38, thereby dividing the photosensitive region into a source side and a drain side.

As shown in FIG. 7(C), on the resultant structure, p-type or semi-insulating InP or InAlGaAs (or InAlAs) is re-grown to a thickness of around 40 nm, and a compound semiconductor re-grown thin film 19 is finally formed for use as the front-side depletion layer formation layer. The front-side depletion layer formation layer 19 covers the side surface of the layer structure exposed to the inside wall of the blind hole 37, and even when a layer of other material has been filled in the blind hole 37, a leakage current is prevented from flowing via the side surface of the layer structure including the channel layer 15.

The entire surface of the resultant structure is coated with a dielectric film formed of $SiN_x$, then the insulating film and re-grown compound semiconductor thin film 19 are partially removed, and a conductive material suitable for the source and drain electrodes 30 and 32, such as AuGe/Ni/Au, is formed by the evaporation and lift-off process. In this process, a mixture of a hydrochloric acid, a phosphoric acid, a lactic acid, and water having a mixing ratio of 1:2:1:1 is used for selective removal of the InP re-grown thin film 19, or a diluted hydrochloric acid (an aqueous HCl solution:$H_2O$=3:1) is used for the selective removal of the InAlAs re-grown film 19.

Furthermore, as shown in FIG. 7(D), the dielectric film is selectively removed and then a gate electrode 31 of Ti/Pt/Au is formed by the evaporation and lift-off process, when necessary.

Figure 10:
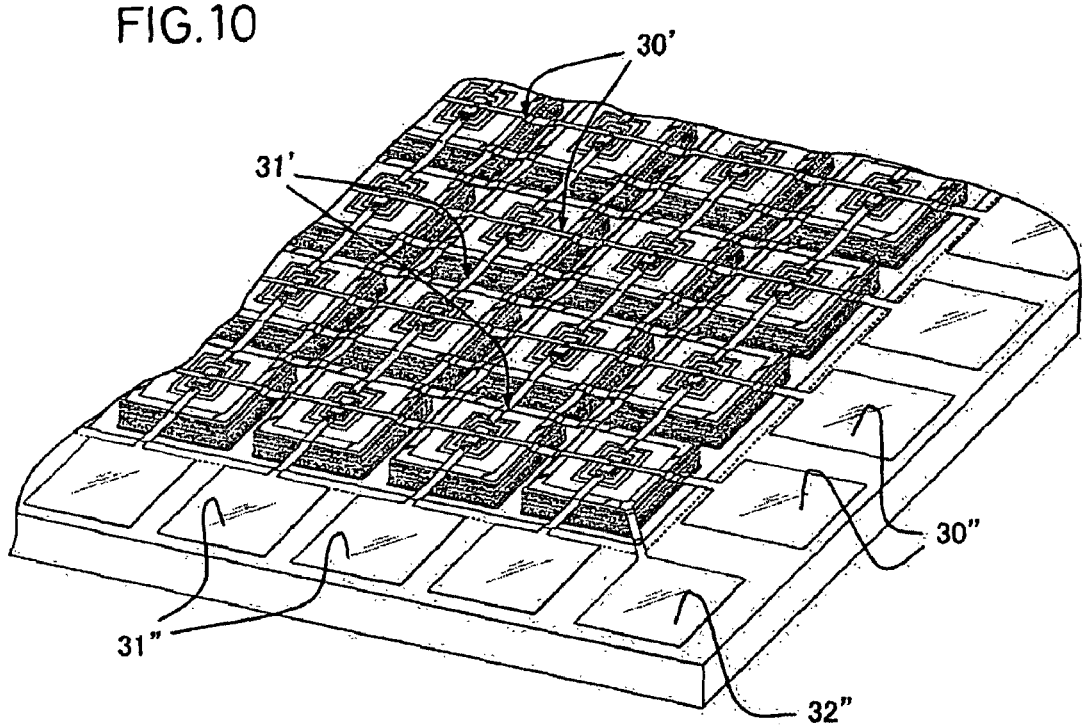
FIG. 10 is a schematic view showing the configuration of one example of a two-dimensional matrix structure comprised of devices shown in FIG. 1.

Therefore, the device of the present embodiment of FIGS. 6-7 constitutes, as a whole, a Schottky gate FET or a pn junction FET having the current path restricted by the pair of blind holes 37 formed in the channel width direction. A point of embodiments of the present invention different from the background art devices is, as shown in FIG. 10 and as described later in detail, that one of the source and drain electrodes surrounds the other when seen from a plan view. As a result, both the channel layer 15 per se and the depletion layer formed by the front-side depletion layer formation layer 19 surround the elongated source electrode 30 to form a structure in which the midway portion on the current path of the channel layer 15 can be shielded infallibly.

As is general in a background GaAs-based or InAlAs-based HEMT, when a buffer layer or a channel layer is of a low-concentration p-type, since a band potential rises on the buffer side, the generated holes have a tendency to dissipate toward the substrate side. Also, in the embodiment shown in FIG. 6, while an p-InP or InAlGaAs re-grown layer 19 constituting the front-side depletion layer formation layer causes the conduction band on the front side to rise, similarly to other embodiments, the photogenerated holes can be suppressed from dissipating toward the substrate side. That is to say, by using the undoped InGaAsP graded layer 27 and n-InP modulation doped layer 29 together as one of the constituent layers of the heterojunction layers sandwiching the channel layer 15, a band profile can be realized, in which electrons are induced in a quantum well formed by the channel layer 15 while holes are drifted from the substrate side to the front side by the graded band structure formed of the graded layer 27. As a consequence, it is possible to secure high photosensitivity. Also, the configuration incorporating the graded layer 27 and modulation doped layer 29 can appropriately be applied to the devices of other embodiments.

In the device structure shown in FIG. 6 comprising the undoped InGaAs channel layer 15 in which electrons have been induced by the n-InP modulation doped layer 29, the recess structure 36, the current-restricted region 38, and the substrate-side depletion layer formation layer 13, four kinds of parameters are effectively combined in accordance with the pn-polarity and concentration of the surface fixed charge to design a band structure. As a result, the sensitivity of the photo-FET can be enhanced by preventing dissipation of the majority carriers or minority carriers, restricting the path for a majority carrier current in accordance with the distance of the interval between the adjacent intermittent blind holes, and causing the current path to be in agreement with the portion of the gate region in which photocarriers are accumulated.

Thus, the addition of the re-growing process for the front-side depletion layer formation layer 19 enables higher device-design freedom than in the device structure shown in FIG. 1, and it is possible to realize a photo-FET exhibiting higher sensitivity than in the background art in a long-wavelength semiconductor having a large leakage current at the surface and interface and also in a compound semiconductor material having a background concentration of p-type.

Figure 8A:
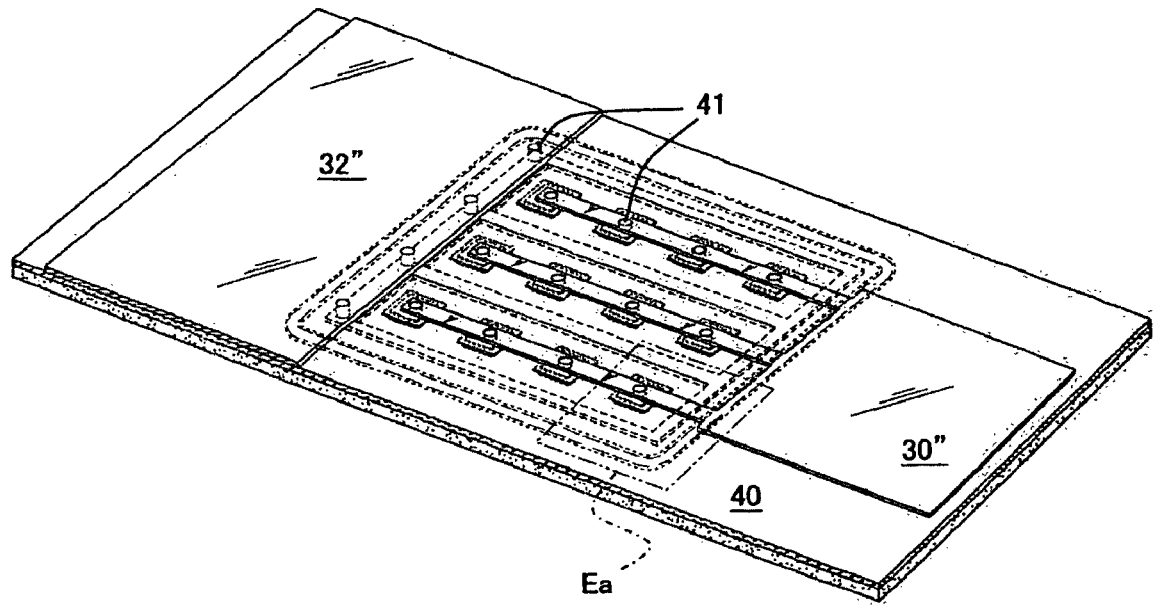
FIG. 8(A) is an explanatory view showing integration of the photo-FET shown in FIG. 1 to expand a light receiving area to several tens of μm or more.
Figure 8B:
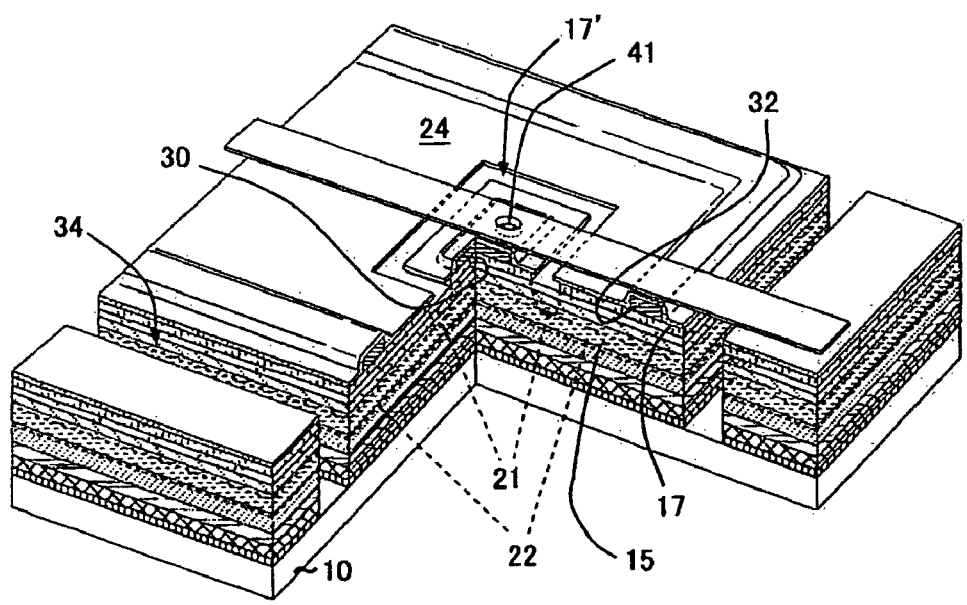
FIG. 8(B) is a partially cutaway explanatory view showing the part surrounded by a frame shown by imaginary line Ea in FIG. 8(A).

FIGS. 8(A) and 8(B) show an embodiment of the integration of the devices of the present invention shown in FIG. 1, in which the light-receiving area is expanded to several tens of $\mu m^2$ or more. FIG. 8(A) is a whole perspective view and FIG. 8(B) is a diagram showing the partially cutaway view of the principal part surrounded by a phantom line frame Ea in FIG. 8(A). In the integrated individual devices, the source electrode 30 is entirely surrounded by the front-side depletion layer 21 (formed, in this case, beneath a recess region 17' of the etch-stop layer 17 serving also as the Schottky contact formation layer, which region 17' is formed in consequence of etching the n-InP modulation doped layer 18 (FIG. 1) in the shape of a groove and by the drain electrode 32, thus incorporating a structure in the present invention. The source and drain electrodes 30 and 32 are interconnected to bonding pads 30" and 32", respectively, via a through hole 41 formed in an insulating layer 40 covering the device surface for three-dimensional wiring through their respective wiring paths. A separating groove 34 circulates whole boundary of the entire photosensitive region. Though this separating groove 34 is also shown in FIGS. 1 to 3, particularly as shown in FIG. 3, it is preferable that the wall surface thereof should be coated with a layer having a polarity opposed to that of the back-gate layer 13 serving also as the substrate-side depletion layer formation layer and having a larger bandgap than the channel layer 15 or the back-gate layer 13 serving also as the substrate-side depletion layer formation layer.

Figure 9:
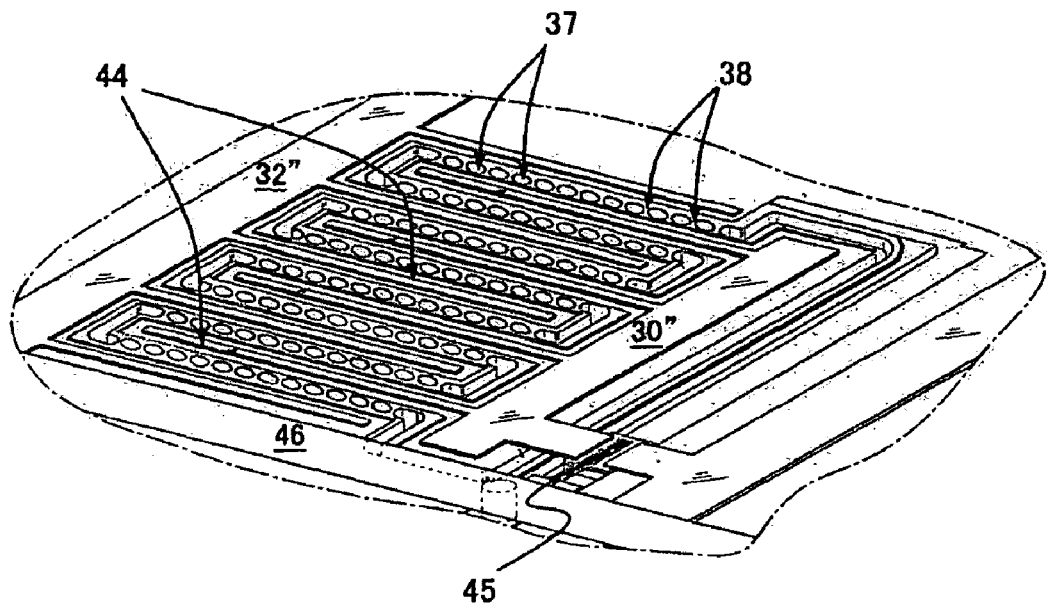
FIG. 9(A) is a schematic view showing the configuration of one example of the integration of the photo-FET shown in FIG. 6.
FIG. 9(B) is an explanatory view showing the principal part in FIG. 9(A).
Figure 9:
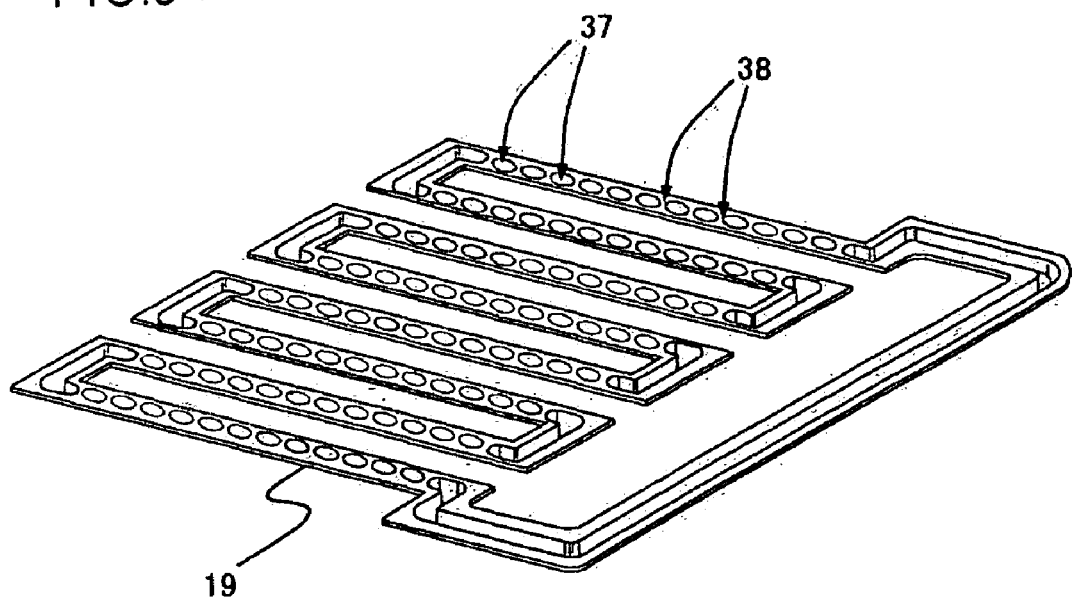

FIG. 9(A) shows another example of integration, FIG. 9(B) shows the principal part thereof, and these figures show an embodiment in which the light-receiving area is enlarged through multiple formation of the photo-FET shown in FIG. 6 within a comb-shaped electrode structure 44 having nested source and drain electrodes 30 and 32. Of course, this embodiment also adopts above-discussed structures of the present invention. Since the entire source electrode 30 including the portion corresponding to a common comb spine for the comb teeth is surrounded by a front-side depletion layer formation layer 19 and also by a drain electrode 32, a channel surrounding the source electrode 30 does not have any contact portion other than the source and drain electrodes. When this comb-shaped structure is spatially stretched, the stretched structure becomes equivalent to a plane structure in which the front-side depletion layer formation layer 19 is disposed concentrically with the central source electrode and, outside the layer 19, the drain electrode is also disposed concentrically. Plural source electrodes disposed in parallel are connected all to a bonding pad 30" for the source electrode, and each drain electrode is wired individually to bonding pads 32", respectively.

Of course, as already stated with respect to the embodiment of FIG. 6, the current in the channel layer between the source and drain electrodes and around a current-restricted region 38 is infallibly cut off without illumination by the depletion layer formed in the presence of the front-side depletion layer formation layer to restrict the path for the majority carrier current. Also, the sensitivity is enhanced by superimposing the current path on the photocarrier accumulated portion beneath the depletion layer formation layer when seen from a plan view. The embodiment of FIG. 9(A) uses the photo-FET shown in FIG. 6 merely as an FET 45 exclusively for readout, disposes the FET in the vicinity of the devices, and supplies address signals from a three-dimensional wiring 46 to the FET to form a structure capable of readout of individual elements of a detector array.

FIG. 10 shows an example of a two-dimensional matrix array structure having integrated the devices shown in FIG. 1. In the plural devices of FIG. 1 arrayed in rows and in columns, the source electrodes 30 in the same row form electric continuity relative to each other by wires 30' and are connected to bonding pads 30" for the source electrodes formed on a suitable substrate, while the gate electrodes 31 in the same column similarly form electric continuity relative to each other by wires 31' and are connected to bonding pads 31" for the gate electrodes. Since the fundamental shape of the photo-FET shown in FIG. 1 has a configuration in which the photodetector and FET are three-dimensionally combined, as described above, it has a function to amplify and read out the photoinduced charge through collecting the photogenerated holes beneath the gate and changing the threshold value of the FET, and a matrix-switching function to block off a photocurrent output through negative biasing of a gate voltage even during light illumination.

Figure 11:
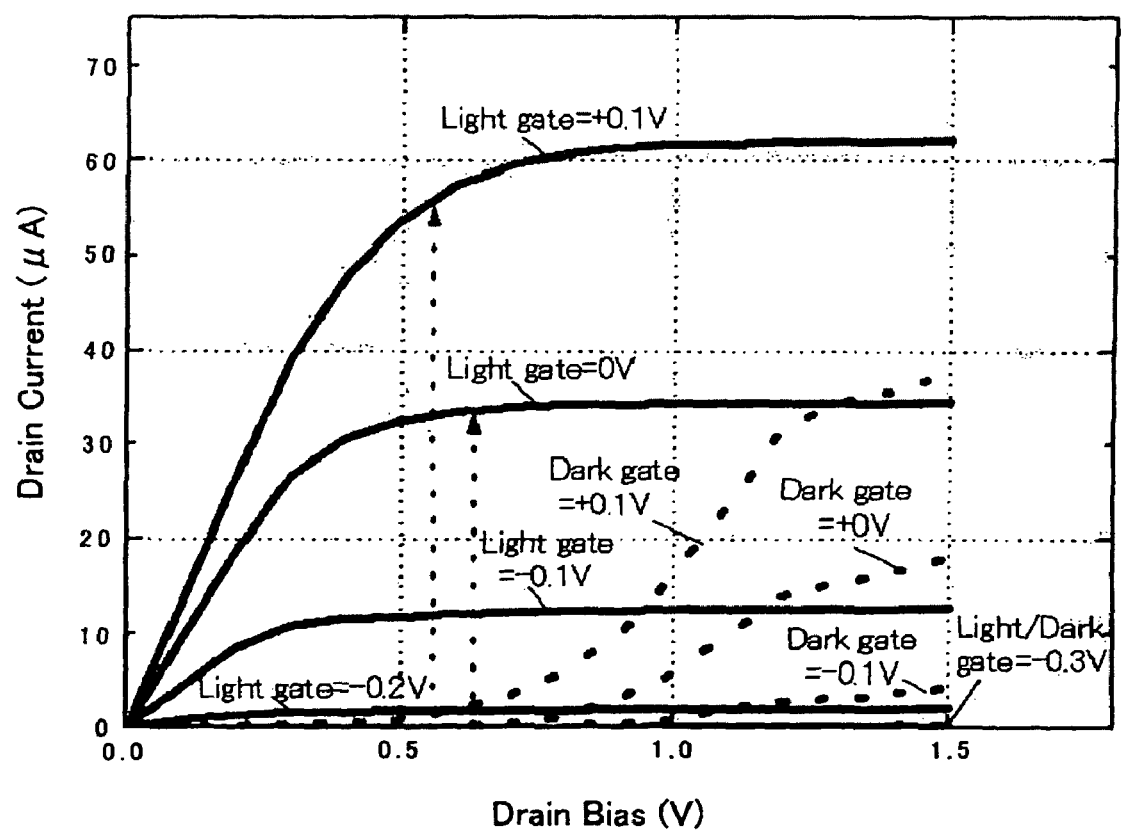
FIG. 11 is an explanatory graph showing the static characteristics of one photo-FET constituting the matrix structure shown in FIG. 10, under illumination and in the dark, respectively.

This point will be described with respect to FIG. 11. Shown by solid lines in FIG. 11 are drain currents plotted relative to gate bias voltages under illumination and by dashed lines in FIG. 11 are those under dark conditions. As will be understood from the uppermost solid curved line showing the drain current-voltage characteristics at a gate bias of +0.1 V under illumination, the drain current can be blocked off even under illumination when the gate voltage has become −0.3 V. On the other hand, no drain current flows at a drain bias of around 0.5 V in the dark conditions even when the gate bias is set to +0.1 V. Therefore, the present inventors found the device functions as an effective photodetector. In the array configuration shown in FIG. 10, utilizing the matrix-switching function, by sequentially biasing specific gate electrodes positively and biasing other electrodes negatively, sequential column readout is made possible.

Figure 12:
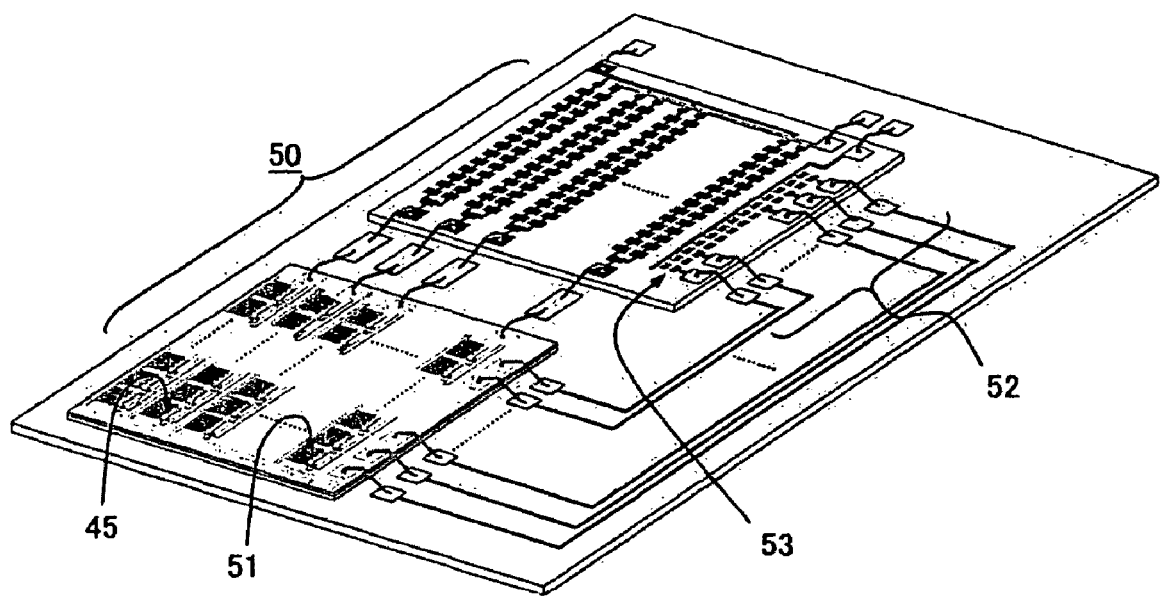
FIG. 12 is a schematic view showing a smart-pixel hybrid integrated circuit configured using the photo-FET of the present invention.

FIG. 12 is a schematic view showing a smart pixel hybrid integrated circuit (IC) device 50 in which each of cells of a compound semiconductor FET array 51 incorporate therein the readout FET 45 of the present invention to read out image signals every one column. A background compound semiconductor image pickup device adopts a structure called an FPA as described above and has been interconnected through the bonding process to a two-dimensional charge amplification array formed of a silicon LSI. On the contrary, when the device of the present invention is used for a photo-FET array 51 or readout FET 46, the signals from the photo-FET arrays 51 can be read out by a pixel column selection signal 52 every one column with an existing silicon signal-processing circuit 53 to make the implementation method or driving method considerably simpler. The present invention can thereby provide a further excellent smart pixel using a compound semiconductor.

In the FPA structure requiring a two-dimensional readout amplification array, since it is not permitted that the readout circuit occupies a larger area than one pixel, it is impossible to fall out of the categories of a mere buffer amplifier and a matrix switch. On the other hand, the IC required for the illustrated module is a one-dimensional array, while the width per channel is restricted to around 100 μm, the length in the depth direction is expandable over several tens of mm and it is made possible to array the readout circuits made of ten thousand transistor devices one-dimensionally. Therefore, it is made possible to perform signal processing of much higher complexity than in the case of a two-dimensional array. The photo-FET of the present invention has sensitivity several thousand times that of an ordinary PIN photo-diode; however, it may become consequently required to integrate a current level of several μA, which would make it difficult to secure a sufficient integral time using a passive CR circuit, and would thereby require a digital signal processing. However, this problem can be solved easily by the signal-processing circuit 53 formed of a silicon IC, by removing a DC component from a modulated optical signal with a high-pass filter, and performing phase sensitive detection in synchronization with the phase of a reference signal to take out only a component having a modulation frequency (lock-in amplification detection), further digitally adding an output from an AD converter and successively sending out integrated values in the individual channels as serial data with a parallel-serial conversion circuit. The processing results can easily be downloaded into a personal computer using a USB connector or similar communication modules.

Figure 13:
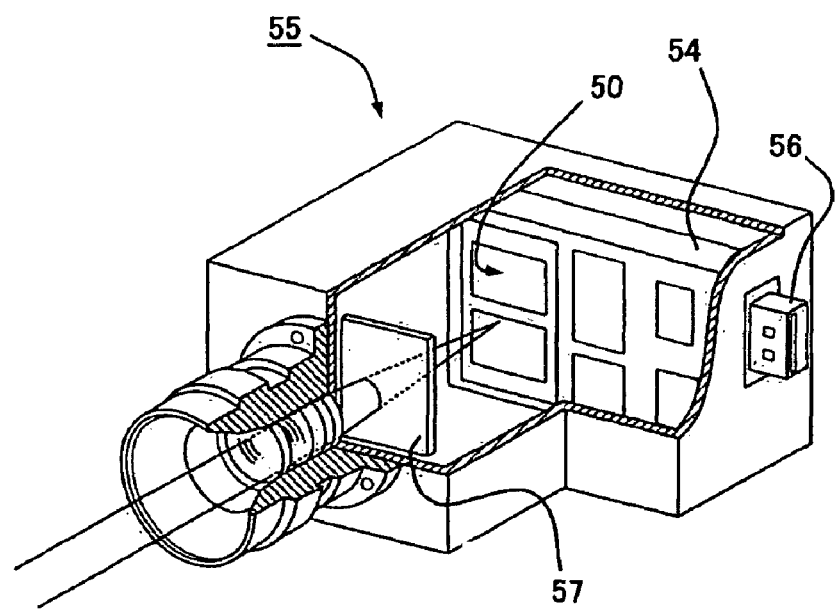
FIG. 13 is a schematic view showing an infrared camera having a USB terminal and using the smart-pixel hybrid integrated circuit device shown in FIG. 12.

For example, FIG. 13 is a schematic view showing an infrared camera 55 incorporating therein a USB module 54 using a smart pixel hybrid IC 50. That structure can obtain infrared images with high sensitivity corresponding to a specific wavelength through modulating an illumination light source into pulses, performing the aforementioned lock-in detection and using an infrared filter 57 together. The processed data can be sent to a personal computer via a USB connector 56 as described above.

Figure 14:
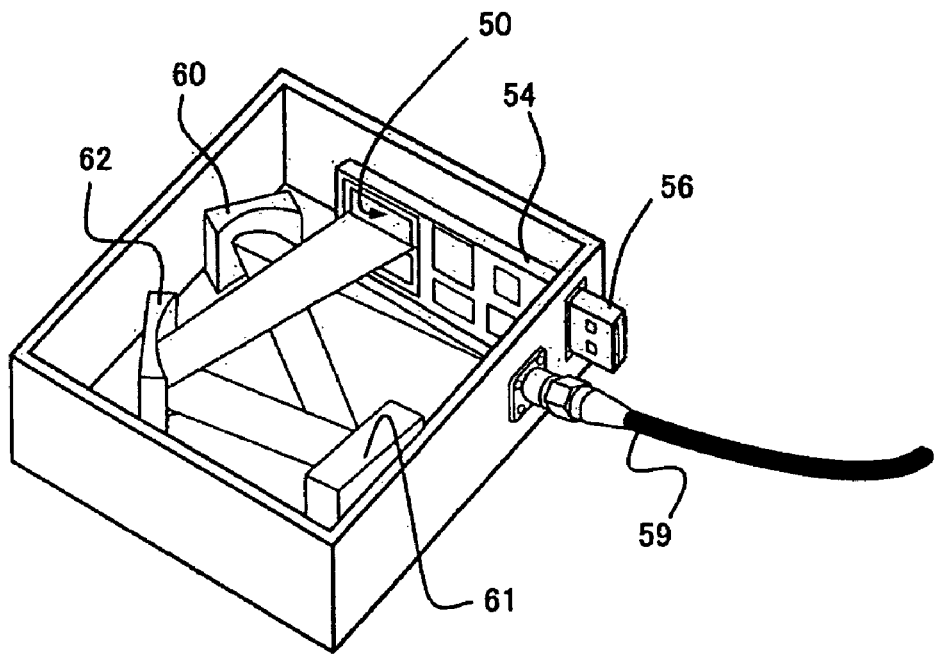
FIG. 14 is a schematic view showing a small spectrophotometer having a USB terminal and using the smart-pixel hybrid integrated circuit shown in FIG. 12.

FIG. 14 shows the case in which a USB module 56 similar to that shown in FIG. 13 is incorporated into a small spectrophotometer 58. In this embodiment, incident light is introduced from an optical fiber 59, passed through a collection mirror 60, a diffraction grating 61, and a focusing mirror 62 in accordance with the configuration of a Czerny-Turner spectrophotometer, and projected on a light-sensitive surface of the USB module 54 (photo-FET array 51 of the smart pixel hybrid IC 50), and thereafter the spectra thereof are measured. In the case of spectroscopic measurement, since the gate function is not required, the module having the recess region 17' shown in FIG. 9 remaining as it is and not forming the gate electrode is generally used as a one-dimensional array of an open-gate photo-FET. The present module can be added with a lock-in detection function if a semiconductor laser or LED is driven in synchronization therewith. The present module can measure the transmission spectral characteristics of infrared light corresponding to the wavelength of a light source with extremely high sensitivity, and can detect noxious gas, such as CO and $CO_2$, and detect the oxygen concentration in in-vivo hemoglobin. Furthermore, spatial distribution of the spectra can be measured when a two-dimensional array is used and an MEMS mirror disposed in the input slit portion is used to perform spatial sweeping.

As shown in FIGS. 1, 2, 3, 6, and 10, a high frequency signal corresponding to a modulation frequency is added directly to the gate electrode of the photo-FET to modulate the photo-FET at several tens of KHz to several MHz, thereby enabling a high-speed lock-in detection. As disclosed with respect to Document 1 noted above, similarly to a developed example of a smart pixel distance meter using visible light, a lock-in detection enables simultaneous measurement of both the intensity and phase of the image signal, while shifting the phase by 90°, thus a compact, infrared, real-time distance meter using a smart pixel can be configured. Since the infrared light is excellent in permeation property relative to mist and eye-safe, a combination thereof with a high-intensity semiconductor light source is suitable for use in a collision avoidance controller.

Figure 15:
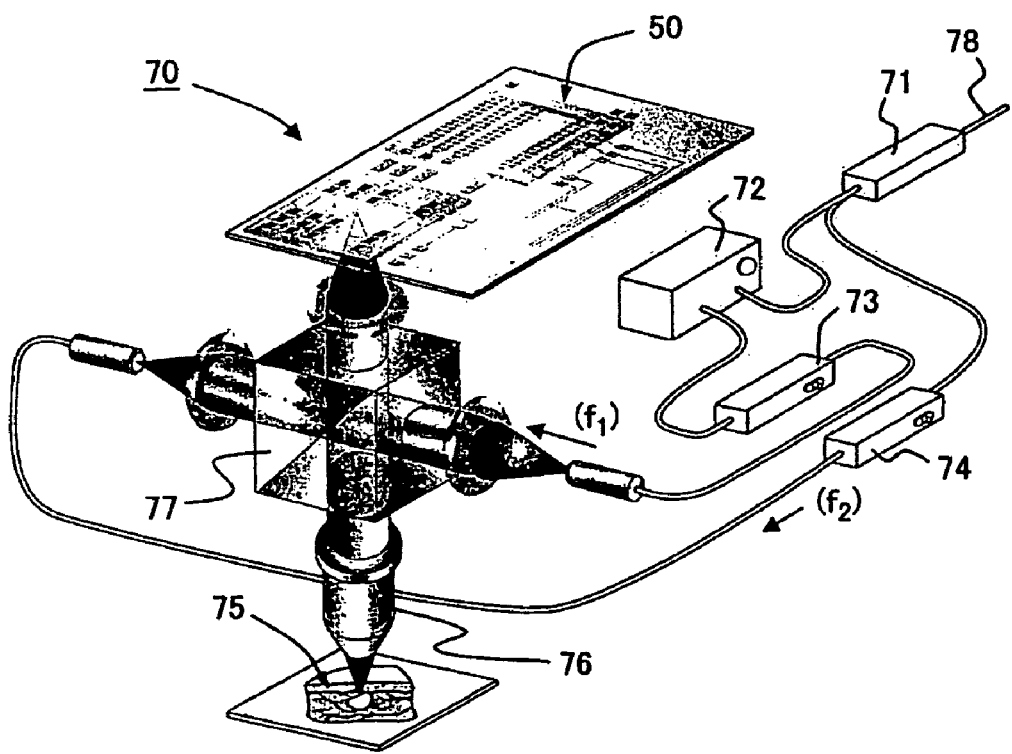
FIG. 15 is a schematic view showing an optical heterodyne microscope using the smart-pixel hybrid integrated circuit device shown in FIG. 12.

FIG. 15 shows one example in which the smart pixel hybrid IC 50 shown in FIG. 12 is applied to an optical topography now focused on as a noninvasive diagnostic technique. While the optical parallelism is utilized in visible region by a silicon CCD or a CMOS image pickup device, there is no highly sensitive array device in the ultraviolet or infrared region comparable to a silicon CCD camera. Therefore, a PMT or discrete avalanche photodiode is currently being used. For this reason, acquisition of two-dimensional or three-dimensional data has no choice but to rely on mechanical sweeping of aperture mechanisms, resulting in consuming an immense amount of time.

On the other hand, as shown in FIG. 15, when the smart pixel hybrid IC 50 formed of hybrid integration of the two-dimensional array of the compound-based photo-FET having high sensitivity from the ultraviolet to infrared region and the silicon integrated circuit for parallel signal processing is incorporated into an optical heterodyne microscope 70, the intensity and phase of weak infrared light can promptly be measured at several tens of MHz by the optical heterodyne detection to enable the acquisition of the three-dimensional topography of a biological body. The optical heterodyne microscope 70 has a function corresponding to that of the integration of several hundreds of PMTs and lock-in amplifiers and can make an optical CT (computerized tomography) system compact, portable and lightweight to enable the application thereof also to clinical inspection etc., which has been large enough to occupy one room with the background art.

In the illustrated example, incoherent light outgoing from a femtosecond laser or white light source 78 is split with a bifurcated optical fiber 71. One bifurcated light passes through a delay element 72, then is modulated at a first frequency of $f_1$ Hz with an acousto-optic modulator 73 and guided to an illuminating system to irradiate a sample 75. The other bifurcated light is modulated at a second frequency of $f_2$ Hz with an acousto-optic modulator 74 and guided to a reference light system. The light having the modulation frequency $f_1$ scattered by the sample 75 and converged with an objective lens 76 is combined with the reference light in a beam splitter 67. In the smart pixel hybrid IC 50, a component of $(f_1-f_2)$ corresponding to the frequency difference between the object light and the reference light is extracted. Consequently, an interference component between the object and the reference light can only be detected and, as a result, phase information of the light scattered by the sample 75, i.e. hologram, can be obtained electronically.

According to the present invention, in a photo-FET having a compound semiconductor essentially expected to attain high speed, it is possible to provide a photo-FET capable of fully solving the background art problems of manufacturing difficulty, as well as suppressing a leakage current or dark current and satisfactorily achieving high photosensitivity.

The photo-FETs of the present inventions can be used as a two-terminal photodetector without a gate electrode and as a three-terminal photodetector with the gate electrode capable of electronic adjustment of the sensitivity, high-speed modulation, and an ON-OFF switching function.

In addition, since the photo-FETs of the present inventions have a function to accumulate photo-generated carriers as majority carriers within the depletion layer formation layer, the light-receiving area does not rely on the diffusion length of the minority carriers and can be enlarged relatively freely. Therefore, similarly to a background PMT, it is relatively easy to provide a light-receiving area on the order of a millimeter. Furthermore, since it can be said that the photo-FETs of the present inventions have a structure in which the lower barrier layer of the HEMT that is one of compound semiconductor FETs is utilized as a light-absorbing layer, it is possible to integrate a photo-FET with an ordinary FET by the same fabrication process using the same epitaxial layer. Moreover, the photo-FET can be fabricated only using standard optical exposure devices, such as an i-line stepper suitable for mass production, the wet-etching, and electrode liftoff processes. Thus, no high-resolution and complicated manufacturing process is required.

The present invention can also provide smart pixel hybrid integrated circuits using a small-sized high-performance compound semiconductor device and can consequently provide extremely small-sized, highly reliable, highly sensitive cameras, spectrometers and optical heterodyne microscopes.

Obviously, numerous additional modifications and variations of the present invention are possible in light of the above teachings. It is therefore to be understood that within the scope of the appended claims, the present invention may be practiced otherwise than as specifically described herein.

The invention claimed is:

1. A compound semiconductor-based photo-FET comprising:
    a substrate;
    a channel layer that constitutes a current path between a source electrode and a drain electrode and serves as part of a photodiode and as part of a photosensitive region;
    a back-gate layer disposed between the substrate and the channel layer, forming a homojunction or a heterojunction relative to the channel layer, elongating a substrate-side depletion layer from the substrate toward the channel layer, applying to the channel layer a back-gate bias by photogenerated carriers upon light illumination, and serving as a substrate-side depletion layer formation layer;
    a barrier layer disposed on a the front side of the channel layer, having a wider bandgap than the channel layer, causing one of the photogenerated carriers to run through the channel layer and the other of the photogenerated carriers to sojourn or be blocked off; and
    a front-side depletion layer formation layer disposed on the front side of the channel layer, elongating a front-side depletion layer from a front side thereof towards the channel layer, bringing the front-side depletion layer into contact with the substrate-side depletion layer without illumination to close the current path in the channel layer, thereby bringing the photo-FET to an off-state.

2. A photo-FET according to claim 1, wherein the carriers running to the channel layer are electrons, and the barrier layer has a valence band offset at an interface with the channel layer larger than a conduction band offset to selectively block holes exclusively at the interface.

3. A photo-FET according to claim 1, wherein the back-gate layer serving as the substrate-side depletion layer formation layer has a polarity opposed to that of majority carriers within the channel layer or is semi-insulating, and has a wider bandgap than the channel layer.

4. A photo-FET according to claim 1, wherein the back-gate layer that serves as the substrate-side depletion layer formation layer has a side surface that is semi-insulating or has an opposed polarity, and includes a buried hetero-structure coated with a layer having a larger bandgap.

5. A photo-FET according to claim 1, further comprising a graded layer in contact with a lower surface of the channel layer so that a band graded structure of the graded layer is utilized to drift the photogenerated carriers from a substrate side to the front side.

6. A photo-FET according to claim 1, wherein the front-side depletion layer formation layer includes plural openings dotted therein, and one of the source and drain electrodes is formed on the front-side depletion layer formation layer to fill all the openings.

7. A photo-FET according to claim 1, wherein the channel layer includes plural blind holes disposed at intervals to at least pass through the channel layer when being seen in a cross-sectional direction, and parts of the channel layer between the adjacent blind holes are configured to serve as a current-restricted region via which a current can only pass through the channel layer.

8. A photo-FET according to claim 7, wherein the front-side depletion layer formation layer covers a side surface of a layer structure that is exposed to inner wall surfaces of the blind holes.

9. A photo-FET according to claim 1, wherein one of the source and drain electrodes is surrounded by the channel layer, whereas the other electrode surrounds the channel layer, when seen from a plan view.

10. A photo-FET according to claim 1, further comprising:
a gate electrode constituting a Schottky junction or pn junction, which is disposed halfway between the source and drain electrodes and on the front-side depletion layer formation layer formed on the channel layer.

11. An integrated photo-FET comprising:
plural photo-FETs each according to claim 1, wherein the adjacent photo-FETs are separated from each other by a separation trench reaching the substrate.

12. An integrated photo-FET according to claim 11, wherein the separation trench includes a wall surface coated with a layer having an opposed polarity to the back-gate layer serving as the substrate-side depletion layer formation layer and having a larger bandgap than the channel layer or the back-gate layer serving as the substrate-side depletion layer formation layer.

13. An integrated photo-FET according to claim 11, wherein the plural photo-FETs are arranged in a matrix form, and the photo-FET according to claim 1 is formed, in every one column, to have a same epitaxial layer structure for read-out.

14. An integrated photo-FET according to claim 11, further comprising:
a gate electrode constituting a Schottky junction or pn junction, which is disposed halfway between the source and drain electrodes and on the front-side depletion layer formation layer formed on the channel layer in each of the plural photo-FETs, wherein each of the plural photo-FETs amplify a photoinduced charge with illumination, read out the amplified photoinduced charge, and block off a photocurrent output in accordance with a voltage applied to the gate electrode even during the illumination.

15. An integrated photo-FET according to claim 13, further comprising:
a gate electrode constituting a Schottky junction or pn junction, which is disposed halfway between the source and drain electrodes and on the front-side depletion layer formation layer formed on the channel layer in each of the plural photo-FETs, wherein each of the plural photo-FETs amplify a photoinduced charge with illumination, read out the amplified photoinduced charge, and block off a photocurrent output in accordance with a voltage applied to the gate electrode even during the illumination.

* * * * *